(12) United States Patent
Cho et al.

(10) Patent No.: US 12,062,333 B2
(45) Date of Patent: Aug. 13, 2024

(54) PIXEL AND DISPLAY DEVICE INCLUDING THE SAME

(71) Applicant: Samsung Display Co., LTD., Yongin-si (KR)

(72) Inventors: Eui Myeong Cho, Yongin-si (KR); Ho Cheol Kang, Yongin-si (KR); Jae Hyun Koh, Yongin-si (KR); Seok Young Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/112,424

(22) Filed: Feb. 21, 2023

(65) Prior Publication Data

US 2023/0267885 A1 Aug. 24, 2023

(30) Foreign Application Priority Data

Feb. 22, 2022 (KR) ........................ 10-2022-0022969

(51) Int. Cl.
*G09G 3/3233* (2016.01)
*H01L 27/146* (2006.01)
*H01L 33/24* (2010.01)
*H01L 33/44* (2010.01)

(52) U.S. Cl.
CPC ......... *G09G 3/3233* (2013.01); *H01L 27/146* (2013.01); *H01L 33/24* (2013.01); *H01L 33/44* (2013.01); *G09G 2300/0426* (2013.01); *G09G 2300/0819* (2013.01); *G09G 2300/0842* (2013.01); *G09G 2320/0233* (2013.01)

(58) Field of Classification Search
CPC ......... G09G 3/3233; G09G 2300/0426; G09G 2300/0819; G09G 2300/0842; G09G 2320/0233; H01L 27/146; H01L 33/24; H01L 33/44
USPC ........................................................ 345/214
See application file for complete search history.

(56) References Cited

U.S. PATENT DOCUMENTS

| | | | |
|---|---|---|---|
| 10,658,605 B2 | 5/2020 | Lee et al. | |
| 2019/0006335 A1* | 1/2019 | Lee | H01L 33/60 |
| 2019/0081261 A1* | 3/2019 | Lee | C09K 11/08 |

(Continued)

FOREIGN PATENT DOCUMENTS

| | | | | |
|---|---|---|---|---|
| CN | 110097842 A | * | 8/2019 | ............ G09G 3/006 |
| KR | 10-2019-0029831 A | | 3/2019 | |

*Primary Examiner* — Mark Edwards
(74) *Attorney, Agent, or Firm* — Lewis Roca Rothgerber Christie LLP

(57) ABSTRACT

A pixel includes a first transistor connected between a first power line and a first node, and including a gate electrode connected to a second node, a second transistor connected between a data line and the second node, and including a gate electrode connected to a scan line, a third transistor connected between a first sensing line and the first node, and including a gate electrode connected to a first control line, a fourth transistor connected between a second sensing line and a third node, and including gate electrode connected to a second control line, a first sub light emitting unit including light emitting elements connected in parallel in a forward direction between the first node and the third node, and a second sub light emitting unit including light emitting elements connected in parallel in the forward direction between the third node and a second power line.

18 Claims, 18 Drawing Sheets

(56) References Cited

U.S. PATENT DOCUMENTS

2019/0318685 A1* 10/2019 Park .................. G09G 3/32
2021/0287579 A1   9/2021 Kang et al.

* cited by examiner

EMU: SEM1, SEM2

EMU: SEM1, SEM2

EMU: SEM1, SEM2

EMU: SEM1, SEM2

PIXEL AND DISPLAY DEVICE INCLUDING THE SAME

CROSS-REFERENCE TO RELATED APPLICATION

This application claims priority to and the benefit of Korean Patent Application No. 10-2022-0022969, filed on Feb. 22, 2022, in the Korean Intellectual Property Office, the entire content of which is incorporated by reference herein.

BACKGROUND

1. Field

The present disclosure relates to a pixel and a display device including the same.

2. Description of the Related Art

As interest in information display increases and the demand to use portable information media increases, a focus is being made on the demand and commercialization a for display devices.

SUMMARY

Aspects and features of embodiments of the present disclosure are to provide a pixel and a display device including the same for determining the number of light emitting elements of each sub light emitting unit included in the pixel.

A display device according to one or more embodiments includes a first transistor including a first electrode connected to a first power line configured to receive a first driving voltage, a second electrode connected to a first node, and a gate electrode connected to a second node, a second transistor including a first electrode connected to a data line, a second electrode connected to the second node, and a gate electrode connected to a scan line, a third transistor including a first electrode connected to a first sensing line, a second electrode connected to the first node, and a gate electrode connected to a first control line, a fourth transistor including a first electrode connected to a second sensing line, a second electrode connected to a third node, and a gate electrode connected to a second control line, a first sub light emitting unit including at least one light emitting element connected in a forward direction between a first electrode of the first sub light emitting unit connected to the first node and a second electrode of the first sub light emitting unit connected to the third node, and a second sub light emitting unit including at least one light emitting element connected in the forward direction between a first electrode of the second sub light emitting unit connected to the third node and a second electrode of the second sub light emitting unit connected to a second power line configured to receive a second driving voltage different from the first driving voltage.

The first sub light emitting unit may be electrically connected to the first sensing line through the third transistor, and the second sub light emitting unit may be electrically connected to the second sensing line through the fourth transistor.

A first reference voltage may be supplied to the first sensing line when the third transistor is turned on, and a second reference voltage lower than the first reference voltage may be supplied to the second sensing line when the fourth transistor is turned on.

When the third transistor and the fourth transistor are turned on, the first transistor and the second transistor may be turned off.

The at least one light emitting element of the first sub light emitting unit is configured to receive a current corresponding to a difference between the first reference voltage and the second reference voltage.

A first reference voltage may be supplied to the first sensing line when the third transistor is turned on. A second reference voltage substantially equal to the first reference voltage may be supplied to the second sensing line when the fourth transistor is turned on. The second reference voltage may be higher than the second driving voltage.

When the third transistor and the fourth transistor are turned on, the first transistor and the second transistor may be turned off.

The at least one light emitting element of the second sub light emitting unit is configured to receive a current corresponding to a difference between the second reference voltage and the second driving voltage.

Each of the light emitting elements may include a first semiconductor layer, a second semiconductor layer different from the first semiconductor layer, and an active layer between the first semiconductor layer and the second semiconductor layer.

A display device according to one or more embodiments includes a first transistor including a first electrode connected to a first power line configured to receive a first driving voltage, a second electrode connected to a first node, and a gate electrode connected to a second node, a second transistor including a first electrode connected to a data line, a second electrode connected to the second node, and a gate electrode connected to a scan line, a third transistor including a first electrode connected to a first sensing line, a second electrode connected to the first node, and a gate electrode connected to a first control line, a fourth transistor including a first electrode connected to a second sensing line, a second electrode connected to a third node, and a gate electrode connected to a second control line, a first sub light emitting unit including at least one light emitting element connected in a reverse direction between a first electrode of the first sub light emitting unit connected to the third node and a second electrode of the first sub light emitting unit connected to the first node, and a second sub light emitting unit including at least one light emitting element connected in the reverse direction between a first electrode of the second sub light emitting unit connected to a second power line configured to receive a second driving voltage different from the first driving voltage and a second electrode of the second sub light emitting unit connected to the third node.

A first reference voltage may be supplied to the first sensing line when the first transistor and the second transistor are turned off and the third transistor and the fourth transistor are turned on. A second reference voltage higher than the first reference voltage may be supplied to the second sensing line when the first transistor and the second transistor are turned off and the third transistor and the fourth transistor are turned on. The second reference voltage may be the same as the second driving voltage.

The at least one light emitting element of the first sub light emitting unit is configured to receive a current corresponding to a difference between the first reference voltage and the second reference voltage.

A first reference voltage may be supplied to the first sensing line when the first transistor and the second transistor are turned off and the third transistor and the fourth transistor are turned on, a second reference voltage substantially equal to the first reference voltage may be supplied to the second sensing line when the first transistor and the second transistor are turned off and the third transistor and the fourth transistor are turned on. The second reference voltage may be lower than the second driving voltage.

The at least one light emitting element of the second sub light emitting unit is configured to receive a current corresponding to a difference between the second reference voltage and the second driving voltage.

A display device driven during a display period and a sensing period according to an embodiment includes a pixel comprising a first sub light emitting unit including at least one light emitting element and electrically connected to a first sensing line, and a second sub light emitting unit including at least one light emitting element and electrically connected to a second sensing line, and a sensing unit electrically connected to the first sensing line and the second sensing line. The sensing unit is configured to determine the number of the at least one light emitting element of the first sub light emitting unit and the number of the at least one light emitting element of the second sub light emitting unit based on a first sub detection current flowing through the first sub light emitting unit and a second sub detection current flowing through the second sub light emitting unit during the sensing period.

The pixel includes a first transistor including a first electrode connected to a first power line configured to receive a first driving voltage, a second electrode connected to a first node, and a gate electrode connected to a second node, a second transistor including a first electrode connected to a data line, a second electrode connected to the second node, and a gate electrode connected to a scan line, a third transistor including a first electrode connected to a first sensing line, a second electrode connected to the first node, and a gate electrode connected to a first control line, and a fourth transistor including a first electrode connected to a second sensing line, a second electrode connected to a third node, and a gate electrode connected to a second control line. The at least one light emitting element of the first sub light emitting unit may be connected in a forward direction between a first electrode of the first sub light emitting unit connected to the first node and a second electrode of the first sub light emitting unit connected to the third node. The at least one light emitting element of the second sub light emitting unit may be connected in a forward direction between a first electrode of the second sub light emitting unit connected to the third node and a second electrode of the first sub light emitting unit connected to a second power line configured to receive a second driving voltage different from the first driving voltage.

The sensing unit is configured to supply a first reference voltage to the first sensing line and supply a second reference voltage lower than the first reference voltage to the second sensing line.

The sensing unit is configured to determine the number of light emitting elements of the first sub light emitting unit with a value obtained by dividing a first detection current applied to the first sub light emitting unit through the first node by the first sub detection current.

The sensing unit is configured to supply a first reference voltage to the first sensing line and supply a second reference voltage substantially equal to the first reference voltage to the second sensing line, and the second reference voltage may be higher than the second driving voltage.

The sensing unit is configured to determine the number of light emitting elements of the second sub light emitting unit with a value obtained by dividing a second detection current applied to the second sub light emitting unit through the third node by the second sub detection current.

According to one or more embodiments, the pixel may detect a current flowing through each light emitting element of each sub light emitting unit to determine the number of light emitting elements of each sub light emitting unit and compensate for deterioration of the pixel in consideration of the number of light emitting elements of each sub light emitting unit.

An effect according to one or more embodiments is not limited by the contents exemplified above, and more various effects are included in the present specification.

BRIEF DESCRIPTION OF THE DRAWINGS

The above and other features of the present disclosure will become more apparent by describing in further detail embodiments thereof with reference to the accompanying drawings, in which.

DETAILED DESCRIPTION

Figure 1:
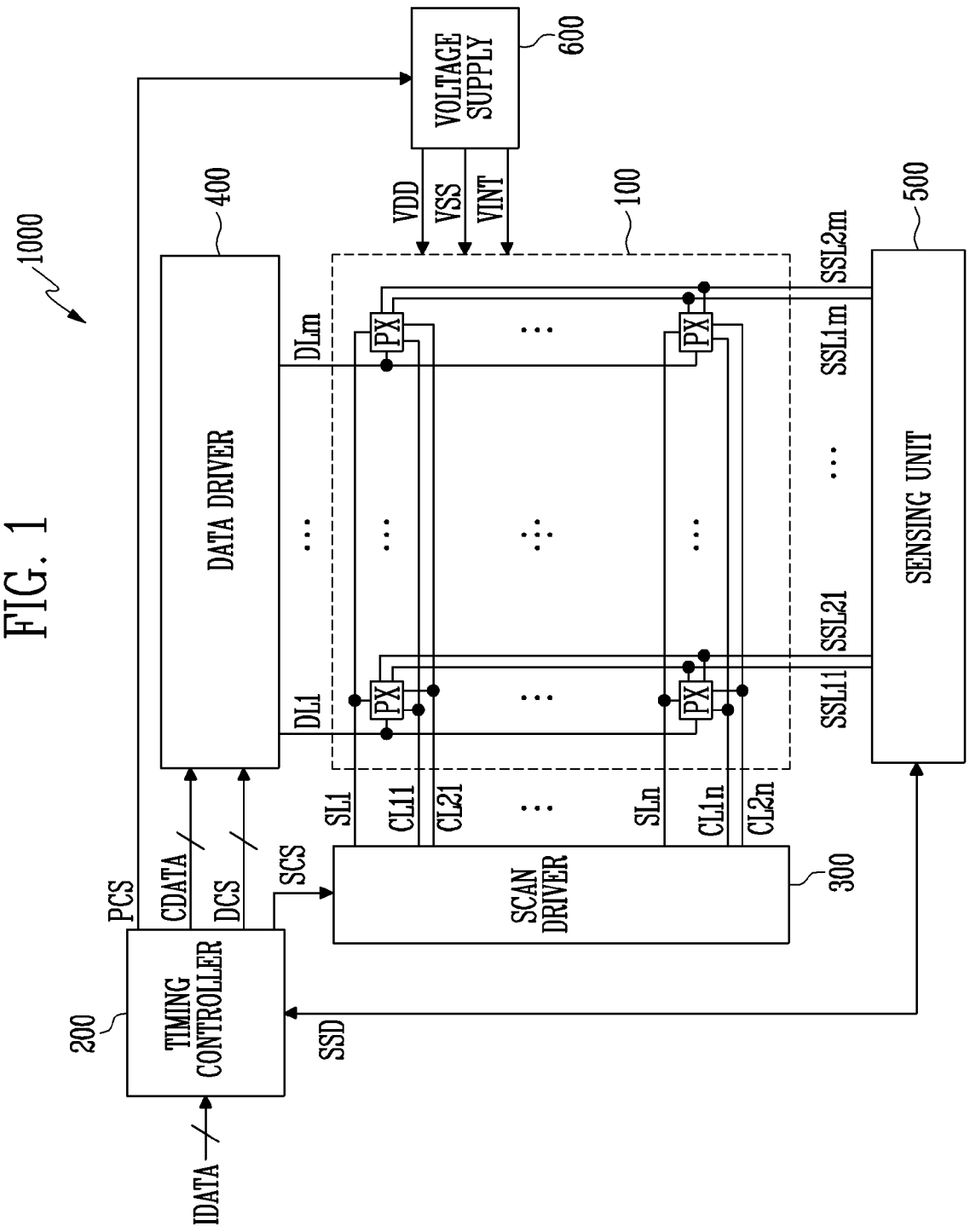
FIG. 1 is a block diagram illustrating a display device according to one or more embodiments.

Because the present disclosure may be modified in various manners and have various forms, specific embodiments will be illustrated in the drawings and will be described in detail in the specification. However, it should be understood that the present disclosure is not intended to be limited to the disclosed specific forms, and the present disclosure includes all modifications, equivalents, and substitutions within the spirit and technical scope of the present disclosure.

Terms of "first", "second", and the like may be used to describe various components, but the components should not be limited by the terms. The terms are used only for the purpose of distinguishing one component from another component. For example, without departing from the scope of the present disclosure, a first component may be referred to as a second component, and similarly, a second component may also be referred to as a first component. The singular expressions include plural expressions unless the context clearly indicates otherwise.

It should be understood that in the present application, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In addition, a case where a portion of a layer, a film, an area, a plate, or the like is referred to as being "on" another portion, it includes not only a case where the portion is "directly on" another portion, but also a case where there is further another portion between the portion and another portion. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion.

Hereinafter, a display device according to one or more embodiments of the present disclosure is described with reference to drawings related to embodiments of the present disclosure.

FIG. 1 is a block diagram illustrating a display device according to one or more embodiments.

Referring to FIG. 1, the display device 1000 may include a pixel unit 100, a timing controller 200, a scan driver 300, a data driver 400, a sensing unit 500, and a voltage supply unit 600.

The display device 1000 may be a flat display device, a flexible display device, a curved display device, a foldable display device, or a bendable display device. In addition, the display device may be applied to a transparent display device, a head-mounted display device, a wearable display device, or the like. In addition, the display device 1000 may be applied to various electronic devices such as a smart phone, a tablet, a smart pad, a TV, and a monitor.

The display device 1000 may be implemented as an organic light emitting display device, an inorganic light emitting display device, or the like. However, this is an example, and a configuration of the display device 1000 is not limited thereto.

In one or more embodiments, the display device 1000 may be driven to include a display period for displaying an image and a sensing period for sensing a characteristic of a driving transistor included in each of pixels PX and detecting a current flowing through a light emitting element of each sub light emitting unit included in the pixels PX.

The pixel unit 100 includes the pixels PX respectively connected to data lines DL1 to DLm (where m is a natural number), scan lines SL1 to SLn (where n is a natural number), first control lines CL11 to CL1n, second control lines CL21 to CL2n, first sensing lines SSL11 to SSL1m, and second sensing lines SSL21 to SSL2m. The pixels PX may receive a first driving voltage VDD, a second driving voltage VSS, and an initialization voltage VINT from the voltage supply unit 600 to be described later. Although n scan lines SL1 to SLn are shown in FIG. 1, the present disclosure is not limited thereto. For example, one or more scan lines, control lines, and the like may be additionally formed in the pixel unit 100 in response to a circuit structure of the pixel PX.

The timing controller 200 may generate a data driving control signal DCS, a scan driving control signal SCS, and a power driving control signal PCS in response to synchronization signals supplied from the outside. The scan driving control signal SCS generated by the timing controller 200 may be supplied to the scan driver 300, the data driving control signal DCS may be supplied to the data driver 400, and the power driving control signal PCS may be supplied to the voltage supply unit 600.

The scan driving control signal SCS may include a scan start signal, a control start signal, and clock signals. The scan start signal may control a timing of a scan signal. The control start signal may control a timing of a control signal. The clock signals may be used to shift the scan start signal and/or the control start signal.

The data driving control signal DCS may include a source start signal and clock signals. The source start signal may control a sampling start time point of data. The clock signals may be used to control a sampling operation.

The power driving control signal PCS may control supply and voltage levels of a first driving voltage VDD, a second driving voltage VSS, and an initialization voltage VINT.

The timing controller 200 may control an operation of the sensing unit 500. For example, the timing controller 200 may control a timing for supplying the initialization voltage VINT to the pixels PX through the first sensing lines SSL11 to SSL1m and/or a timing for sensing a current generated in the pixel PX through the first sensing lines SSL11 to SSL1m and the second sensing lines SSL21 to SSL2m.

The timing controller 200 may generate a compensation value for compensating for a characteristic value of the pixels PX based on sensing data SSD provided from the sensing unit 500. Here, the sensing data SSD may be a value corresponding to a current and/or a voltage for generating compensation image data CDATA sensed through the first sensing lines SSL11 to SSL1m and the second sensing lines SSL21 to SSL2m.

The timing controller 200 may compensate for input image data DATA by reflecting a threshold voltage change of a driving transistor included in the pixel PX, a mobility change, and a characteristic change of a light emitting element. The timing controller 200 may supply the compensation image data CDATA generated by reflecting the sensing data SSD to the input image data DATA to the data driver 400.

The scan driver 300 may receive the scan driving control signal SCS from the timing controller 200. The scan driver 300 may be electrically connected to the scan lines SL1 to SLn, the first control lines CL11 to CL1n, and the second control lines CL21 to CL2n. The scan driver 300 receiving the scan driving control signal SCS may supply the scan signal to the scan lines SL1 to SLn and may supply the control signal to the first control lines CL11 to CL1n and the second control lines CL21 to CL2n, respectively.

For example, the scan driver 300 may sequentially supply the scan signal to the scan lines SL1 to SLn. When the scan signal is sequentially supplied to the scan lines SL1 to SLn, the pixels PX may be selected in a horizontal line unit. To this end, the scan signal may be set to a gate-on voltage (for example, a logic high level) so that transistors included in the pixels PX are turned on.

Similarly, the scan driver 300 may supply a first control signal and a second control signal to the first control lines CL11 to CL1n and the second control lines CL21 to CL2n, respectively. The first control signal and the second control signal may be used to sense (or extract) a driving current (that is, a current flowing through a driving transistor) flowing through the pixel PX. In addition, in one or more embodiments, the first control signal and the second control signal may be used to predict the number of light emitting elements of each sub light emitting unit included in the pixel PX. A timing at which the scan signal and the control signals are supplied and a waveform of the scan signal and the control signals may be set differently according to the display period and the sensing period.

In FIG. 1, a scan driver 300 outputs both of the scan signal and the control signals, but the present disclosure is not limited thereto. For example, the scan driver 300 may include a first scan driver that supplies the scan signal to the pixel unit 100 and a second scan driver that supplies the control signals to the pixel unit 100.

The data driver 400 may receive the data driving control signal DCS from the timing controller 200. The data driver 400 may be electrically connected to the data lines DL1 to DLm. The data driver 400 may supply a data signal (for example, a sensing data signal) for detecting a pixel characteristic to the pixel unit 100 through the data lines DL1 to DLm in the sensing period. In addition, the data driver 400 may supply a data signal (for example, an image data signal) for image display based on the compensation image data CDATA to the pixel unit 100 through the data lines DL1 to DLm in the display period.

The sensing unit 500 may be electrically connected to the first sensing lines SSL11 to SSL1m and the second sensing lines SSL21 to SSL2m.

The sensing unit 500 may supply a suitable voltage (e.g., a predetermined voltage) for image display to the pixel unit 100 through the first sensing lines SSL11 to SSL1m in the display period.

The sensing unit 500 may receive a sensing value (for example, characteristic information of the driving transistor, information of the light emitting element, or the like) provided from at least one pixel PX from among the pixels PX through the first sensing lines SSL11 to SSL1m in the sensing period, and supply the sensing data SSD to the timing controller 200.

In addition, in the sensing period, the sensing unit 500 may detect the current flowing through the light emitting element of each sub light emitting unit included in the pixels PX through the first sensing lines SSL11 to SSL1m and the second sensing lines SSL21 to SSL2m, and may predict the number of light emitting elements of each sub light emitting unit. For example, the sensing unit 500 may supply a reference voltage (e.g., a predetermined reference voltage) through the first sensing lines SSL11 to SSL1m and the second sensing lines SSL21 to SSL2m, respectively, to extract the current (or a current value) flowing through the light emitting element of the sub light emitting unit connected to each of the sensing lines. For example, the sensing unit 500 may supply a first reference voltage to the first sensing lines SSL11 to SSL1m, and supply a second reference voltage lower than the first reference voltage to the second sensing lines SSL21 to SSL2m, to detect the current value flowing through the light emitting element of the sub light emitting unit. Alternatively, the sensing unit 500 may supply a first reference voltage to the first sensing lines SSL11 to SSL1m, and supply a second reference voltage equal to the first reference voltage to the second sensing lines SSL21 to SSL2m to detect the current value flowing through the light emitting element of the sub light emitting unit.

The sensing unit 500 may detect the current flowing through the light emitting element of each sub light emitting unit to predict the number of light emitting elements of each sub light emitting unit. Therefore, because the pixel according to one or more embodiments may detect the current flowing through each light emitting element of each sub light emitting unit and predict the number of light emitting elements of each sub light emitting unit, deterioration of the pixel may be compensated in consideration of the number of light emitting elements of each sub light emitting unit. Accordingly, luminance uniformity of the pixel unit may be improved.

In FIG. 1, the sensing unit 500 is a configuration separated from the timing controller 200, but at least a partial configuration of the sensing unit 500 may be included in the timing controller 200. For example, the sensing unit 500 and the timing controller 200 may be formed of a driving IC. Furthermore, the data driver 400 may also be included in the timing controller 200. Therefore, at least a portion of the sensing unit 500, the data driver 400, and the timing controller 200 may be formed of the driving IC.

The voltage supply unit 600 may supply the first driving voltage VDD, the second driving voltage VSS, and the initialization voltage VINT to the pixel unit 100 based on the power driving control signal PCS. In one or more embodiments, the first driving voltage VDD may determine a voltage (for example, a drain voltage) of a first electrode of the driving transistor, and the second driving voltage VSS may determine a cathode voltage of the light emitting element. In addition, the initialization voltage VINT may provide a suitable voltage (e.g., a predetermined voltage) capable of sensing the characteristics of the driving transistor in the sensing period.

Hereinafter, a display device according to one or more embodiments is described with reference to FIG. 2.

Figure 2:
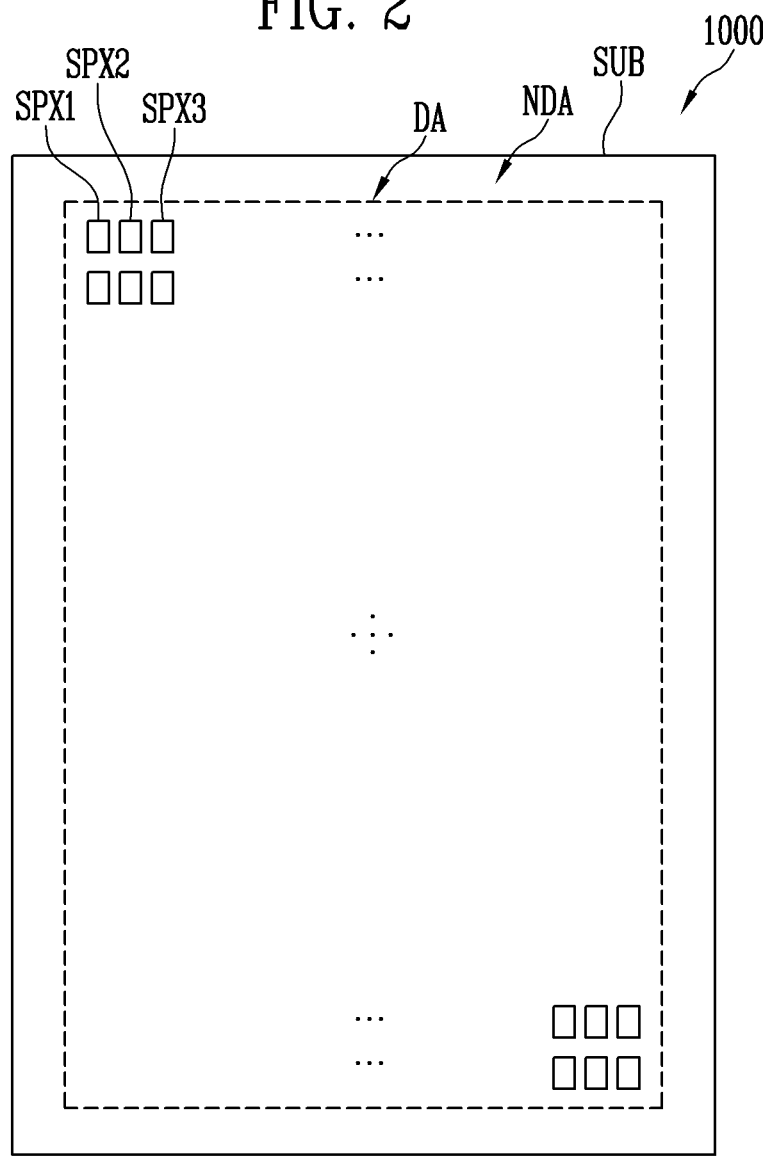
FIG. 2 is a plan view schematically illustrating a display device according to one or more embodiments.

FIG. 2 is a plan view schematically illustrating a display device according to one or more embodiments.

Referring to FIG. 2, the display device 1000 may include a substrate SUB and pixels PX disposed on the substrate SUB.

The substrate SUB may configure a base member of the display device 1000. The substrate SUB may be a rigid or flexible substrate or film.

The substrate SUB may include a display area DA and a non-display area NDA.

The display area DA is an area in which the pixel PX is disposed to display an image. The non-display area NDA is an area other than the display area DA and may be around (e.g., surround) at least a portion of the display area DA along an edge or periphery of the display area DA. A driving circuit unit connected to the pixel PX of the display area DA, lines, and pads may be disposed in the non-display area NDA. According to one or more embodiments, the non-display area NDA may be disposed inside the display area DA.

According to an example, the pixel PX may be arranged according to a stripe or PENTILE® arrangement structure, but is not limited thereto, and various known embodiments may be applied. The PENTILE® arrangement structure may be referred to as an RGBG matrix structure (e.g., a PEN- TILE® matrix structure or an RGBG structure (e.g., a PENTILE® structure)). PENTILE® is a registered trademark of Samsung Display Co., Ltd., Republic of Korea.

According to one or more embodiments, the pixel PX may include a first sub-pixel SPX1, a second sub-pixel SPX2, and a third sub-pixel SPX3. Each of the first sub-pixel SPX1, the second sub-pixel SPX2, and the third sub-pixel SPX3 may be a sub-pixel. At least one of the first sub-pixel SPX1, the second sub-pixel SPX2, and the third sub-pixel SPX3 may configure a pixel unit capable of emitting light of various colors.

For example, each of the first sub-pixel SPX1, the second sub-pixel SPX2, and the third sub-pixel SPX3 may emit light of a desired color (e.g., a predetermined color). For example, the first sub-pixel SPX1 may be a red pixel emitting light of a red color (for example, a first color), the second sub-pixel SPX2 may be a green pixel emitting light of a green color (for example, a second color), and the third sub-pixel SPX3 may be a blue pixel emitting light of a blue color (for example, a third color). However, the color, type, number, and/or the like of the first sub-pixel SPX1, the second sub-pixel SPX2, and the third sub-pixel SPX3 configuring each pixel unit are not limited to a specific example.

Hereinafter, a light emitting element included in a display device according to one or more embodiments is described with reference to FIG. 3.

Figure 3:
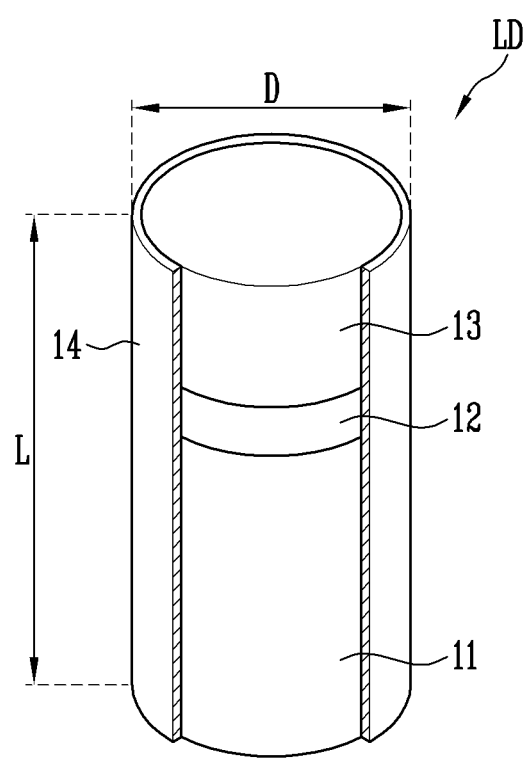
FIG. 3 is a perspective cutaway view illustrating a light emitting element included in a display device according to one or more embodiments.

FIG. 3 is a perspective cutaway view illustrating a light emitting element included in a display device according to one or more embodiments.

Referring to FIG. 3, the light emitting element LD included in the display device according to one or more embodiments includes a first semiconductor layer 11, a second semiconductor layer 13, and an active layer 12 positioned between the first semiconductor layer 11 and the second semiconductor layer 13. For example, the light emitting element LD may be configured as a stack in which the first semiconductor layer 11, the active layer 12, and the second semiconductor layer 13 are sequentially stacked along a length L direction.

The light emitting element LD may be provided in a rod shape extending in one direction, that is, a cylinder shape. When an extension direction of the light emitting element LD is referred to as the length L direction, the light emitting element LD may have one side end and another side end along the length L direction. Although FIG. 3 shows a light emitting element LD of a column shape, the type and/or shape of the light emitting element according to one or more embodiments are not limited thereto.

The first semiconductor layer 11 may include at least one n-type semiconductor layer. For example, the first semiconductor layer 11 may include any one semiconductor material from among InAlGaN, GaN, AlGaN, InGaN, AlN, and InN, and may include an N-type semiconductor layer doped with a first conductive dopant such as silicon (Si), germanium (Ge), or tin (Sn). However, the material configuring the first semiconductor layer 11 is not limited thereto, and various other materials may configure the first semiconductor layer 11.

The active layer 12 may be disposed on the first semiconductor layer 11 and may be formed in a single or multiple quantum well structure. In one or more embodiments, a clad layer doped with a conductive dopant may be formed on and/or under the active layer 12. For example, the clad layer may be formed of an AlGaN layer or an InAlGaN layer. According to one or more embodiments, a material such as AlGaN or InAlGaN may be used to form the active layer 12, and various other materials may configure the active layer 12.

When a voltage equal to or greater than a threshold voltage is applied to both ends of the light emitting element LD, the light emitting element LD emits light while electron-hole pairs are combined in the active layer 12. By controlling light emission of the light emitting element LD using such a principle, the light emitting element LD may be used as a light source of various light emitting devices including the pixel of the display device.

The second semiconductor layer 13 may be disposed on the active layer 12 and may include a semiconductor layer of a type different from that of the first semiconductor layer 11. For example, the second semiconductor layer 13 may include at least one P-type semiconductor layer. For example, the second semiconductor layer 13 may include at least one semiconductor material from among InAlGaN, GaN, AlGaN, InGaN, AlN, and InN, and may include a P-type semiconductor layer doped with a second conductive dopant such as magnesium (Mg), zinc (Zn), calcium (Ca), strontium (Sr) or barium (Ba). However, the material configuring the second semiconductor layer 13 is not limited thereto, and various other materials may configure the second semiconductor layer 13.

In the above-described embodiment, each of the first semiconductor layer 11 and the second semiconductor layer 13 is configured of one layer, but the present disclosure is not limited thereto. In one or more embodiments, according to the material of the active layer 12, each of the first semiconductor layer 11 and the second semiconductor layer 13 may further include one or more layers, for example, a clad layer and/or a tensile strain barrier reducing (TSBR) layer. The TSBR layer may be a strain alleviating layer disposed between semiconductor layers of which lattice structures are different to serve as a buffer for reducing a lattice constant difference. The TSBR layer may be configured of a P-type semiconductor layer such as P—GaInP, P—AlInP, or P—AlGaInP, but the present disclosure is not limited thereto.

In addition, according to one or more embodiments, the light emitting element LD may further include an insulating layer 14 provided on a surface (e.g., an outer surface or an outer peripheral or circumferential surface). The insulating layer 14 may be formed on the surface of the light emitting element LD to be around (e.g., surround) an outer surface (e.g., an outer peripheral or circumferential surface) of the active layer 12, and may further surround one area of the first semiconductor layer 11 and the second semiconductor layer 13. However, according to one or more embodiments, the insulating layer 14 may expose the both ends of the light emitting element LD having different polarities. For example, the insulating layer 14 may not cover and expose one end of each of the first semiconductor layer 11 and the second semiconductor layer 13 positioned at the both ends of the light emitting element LD in the length L direction, for example, two bottom surfaces of a cylinder (an upper surface and a lower surface of the light emitting element LD).

When the insulating layer 14 is provided on the surface (e.g., the outer surface or the outer peripheral or circumferential surface) of the light emitting element LD, in particular, a surface of the active layer 12, the active layer 12 may be prevented from being short-circuited with at least one electrode (for example, at least one contact electrode from among contact electrodes connected to the both ends of the light emitting element LD) or the like that is not shown. Accordingly, electrical stability of the light emitting element LD may be secured.

In addition, as the light emitting element LD includes the insulating layer 14 on the surface thereof, a surface defect of the light emitting element LD may be reduced or minimized, and thus a lifespan and efficiency may be improved. In addition, when the light emitting element LD includes the insulating layer 14, even though a plurality of light emitting elements LD are disposed close to each other, occurrence of an unwanted short circuit between the light emitting elements LD may be prevented.

In addition, in one or more embodiments, the light emitting element LD may be manufactured through a surface treatment process. For example, the surface treatment may be performed on each light emitting element LD so that when a plurality of light emitting elements LD are mixed in a fluid solution (or solvent) and supplied to each emission area (for example, an emission area of each pixel), the light emitting elements LD may be uniformly dispersed in the solution without being un-uniformly aggregated.

In one or more embodiments, the light emitting element LD may further include an additional component in addition to the first semiconductor layer 11, the active layer 12, the second semiconductor layer 13, and the insulating layer 14. For example, the light emitting element LD may additionally include one or more phosphor layers, active layers, semiconductor layers and/or electrodes disposed on one end side of the first semiconductor layer 11, the active layer 12, and the second semiconductor layer 13.

The light emitting element LD may be used in various types of devices requiring a light source, including a display device. For example, at least one light emitting element LD, for example, a plurality of light emitting elements LD each having a size of a nano scale to a micro scale, may be disposed in each pixel area of the display device, and the light emitting elements LD may be used to configure a light source (or a light source unit) of each pixel. However, in the present disclosure, an application field of the light emitting element LD is not limited to the display device. For example, the light emitting element LD may be used in other types of devices requiring a light source, such as a lighting device.

Hereinafter, a pixel according to one or more embodiments is described with reference to FIG. 4.

Figure 4:
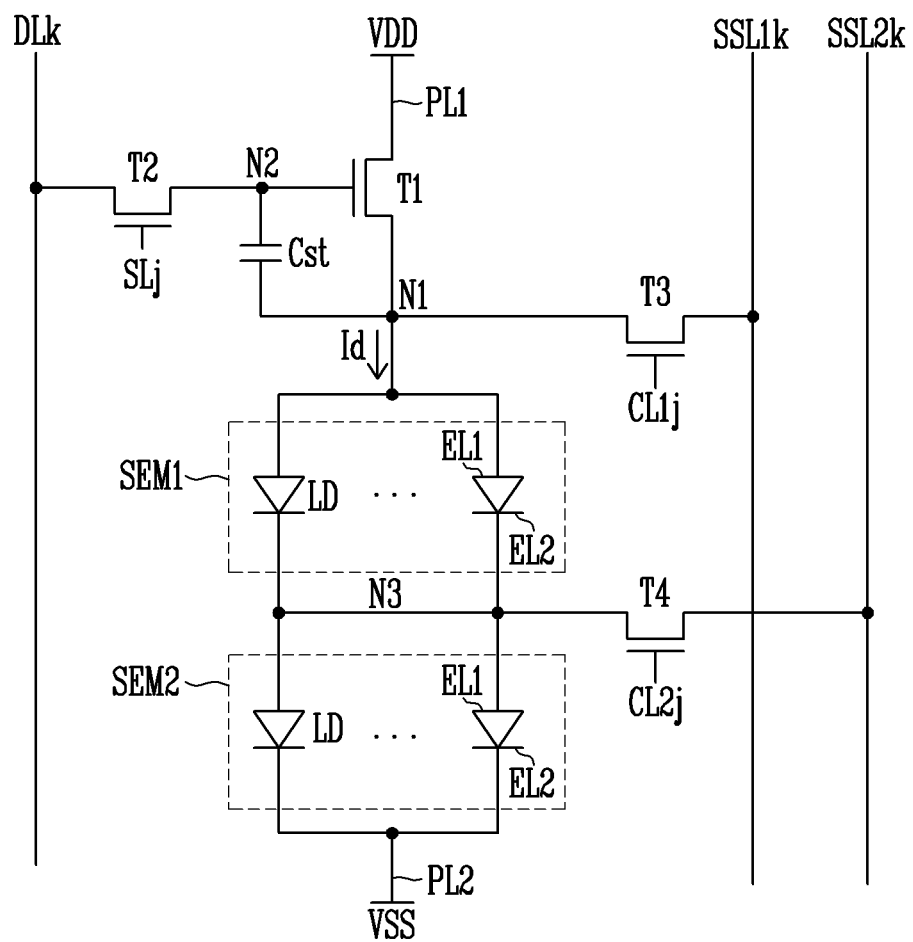
FIG. 4 is a circuit diagram illustrating an example of a pixel according to one or more embodiments.

FIG. 4 is a circuit diagram illustrating an example of a pixel according to one or more embodiments. In FIG. 4, a pixel PX positioned in a j-th row (horizontal line) and positioned in a k-th column is shown for convenience of description.

Referring to FIG. 4, the pixel PX according to one or more embodiments may include a first transistor T1, a second transistor T2, a third transistor T3, a fourth transistor T4, a storage capacitor Cst, and a light emitting unit EMU.

A first electrode of the first transistor T1 (or a driving transistor) may be connected to a first power line PL1 to which the first driving voltage VDD is applied, and a second electrode may be connected to a first node N1 (or a first electrode EL1 of the light emitting unit EMU). A gate electrode of the first transistor T1 may be connected to a second node N2. In one or more embodiments, the first electrode may be a drain electrode, and the second electrode may be a source electrode. The first transistor T1 may control a current amount of a driving current Id flowing to the light emitting unit EMU in response to a voltage of the second node N2.

A first electrode of the second transistor T2 (or a switching transistor) may be connected to a data line DLk, and a second electrode may be connected to the second node N2 (or the gate electrode of the first transistor T1). A gate electrode of the second transistor T2 may be connected to a scan line SLj. The second transistor T2 may be turned on when a scan signal (for example, a high level voltage) is supplied to the scan line SLj, to transmit a data voltage from the data line DLk to the second node N2.

A first electrode of the third transistor T3 may be connected to a first sensing line SSL1k, and a second electrode may be connected to the first node N1 (or the second electrode of the first transistor T1). A gate electrode of the third transistor T3 may be connected to a first control line CL1j. The third transistor T3 may be turned on when a first control signal (for example, a high level voltage) is supplied to the first control line CL1j during the sensing period, to electrically connect the first sensing line SSL1k and the first node N1.

A first electrode of the fourth transistor T4 may be connected to a second sensing line SSL2k, and a second electrode may be connected to a third node N3. A gate electrode of the fourth transistor T4 may be connected to a second control line CL2j. The fourth transistor T4 may be turned on when a second control signal (for example, a high level voltage) is supplied to the second control line CL2j during the sensing period, to electrically connect the second sensing line SSL2k and the third node N3.

In one or more embodiments, the third transistor T3 and the fourth transistor T4 may be turned on during the sensing period, and may be used to detect and predict a current flowing through the light emitting element LD of each sub light emitting unit. At this time, the first transistor T1 and the second transistor T2 may be in a turn-off state.

The storage capacitor Cst is connected between the first node N1 and the second node N2. The storage capacitor Cst may charge a data voltage corresponding to a data signal supplied to the second node N2 during one frame. Accordingly, the storage capacitor Cst may store a voltage corresponding to a voltage difference between the first node N1 and the second node N2. For example, the storage capacitor Cst may store a voltage corresponding to a difference between the data voltage supplied to the gate electrode of the first transistor T1 and the initialization voltage VINT (refer to FIG. 1) supplied to the second electrode of the first transistor T1.

The light emitting unit EMU may include the light emitting units LD connected in series and/or in parallel between the first power line PL1 to which the first driving voltage VDD is applied and a second power line PL2 to which the second driving voltage VSS is applied. For example, the first driving voltage VDD may be higher than the second driving voltage VSS. The present disclosure is not limited thereto, and according to one or more embodiments, the second driving voltage VSS may be higher than the first driving voltage VDD.

The light emitting unit EMU may generate light of a desired luminance (e.g., a predetermined luminance) in response to the driving current Id supplied from the first transistor T1. For example, during one frame period, the first transistor T1 may supply the driving current Id corresponding to a grayscale value of the corresponding frame data (for example, the compensation data CDATA, refer to FIG. 1) to the light emitting unit EMU. The driving current Id supplied to the light emitting unit EMU may be divided and may flow through the light emitting elements LD. Here, the current divided and flowing through the light emitting elements LD may be referred to as a sub driving current. Each light emitting element LD may emit light with a luminance corresponding to the sub driving current, and the light emitting unit EMU may emit light of a luminance corresponding to the driving current Id.

For example, the light emitting unit EMU may include the light emitting elements LD connected in series and in parallel. Among the light emitting elements LD connected in parallel, each light emitting element LD connected in the same direction may configure an effective light source. In addition, the light emitting elements LD connected in parallel in the same direction may configure a sub light emitting unit.

The light emitting unit EMU may include at least one sub light emitting unit. For example, the light emitting unit EMU may include a first sub light emitting unit SEM1 and a second sub light emitting unit SEM2. Each sub light emitting unit may be connected in series to configure the light emitting unit EMU. Although two sub light emitting units are shown in FIG. 4, the present disclosure is not limited thereto. According to one or more embodiments, the number of sub light emitting units included in the light emitting unit EMU may be various. In addition, for example, the light emitting element LD may be disposed in a forward direction or a reverse direction in each sub light emitting unit during a process. In order to help understanding, FIG. 4 illustrates the sub light emitting unit including at least one light emitting element LD disposed in the forward direction. Accordingly, in FIG. 4, the light emitting element LD disposed in the reverse direction is omitted. The sub light emitting unit including at least one light emitting element LD disposed in the reverse direction is described with reference to FIG. 9 and a subsequent figure.

The first sub light emitting unit SEM1 may include the light emitting elements LD connected in parallel between the first electrode EL1 connected to the first node N1 and the second electrode EL2 connected to the third node N3. Here, the first electrode EL1 may be an anode and the second electrode EL2 may be a cathode, but the present disclosure is not limited thereto. According to one or more embodiments, the first electrode EL1 may be a cathode, and the second electrode EL2 may be an anode.

The second sub light emitting unit SEM2 may include the light emitting elements LD connected in parallel between the first electrode EL1 connected to the third node N3 and the second electrode EL2 connected to the second driving voltage VSS through the second power line PL2.

The number of light emitting elements LD of the first sub light emitting unit SEM1 may be identical to or different from the number of light emitting elements LD of the second sub light emitting unit SEM2. For example, the number of light emitting elements LD of the first sub light emitting unit SEM1 may be greater than the number of light emitting elements LD of the second sub light emitting unit SEM2, or the number of light emitting elements LD of the first sub light emitting unit SEM1 may be less than the number of light emitting elements LD of the second sub light emitting unit SEM2.

A magnitude of a current flowing through one light emitting element LD included in each sub light emitting unit may vary according to the number of light emitting elements LD of each sub light emitting unit. For example, in a case where the number of light emitting elements LD of the first sub light emitting unit SEM1 is greater than the number of light emitting elements LD of the second sub light emitting unit SEM2, when a constant driving current is applied to the light emitting unit EMU, the magnitude of the current flowing through each light emitting element LD included in the first sub light emitting unit SEM1 may be less than the magnitude of the current flowing through each light emitting element LD included in the second sub light emitting unit SEM2.

In one or more embodiments, the number of light emitting elements LD of the first sub light emitting unit SEM1 and the second sub light emitting unit SEM2 may be predicted by detecting the current flowing through each light emitting element LD of each of the sub light emitting units SEM1 and SEM2. For example, the number of light emitting elements LD of the first sub light emitting unit SEM1 and the second sub light emitting unit SEM2 may be predicted by detecting the current flowing through each light emitting element LD of each of the sub light emitting units SEM1 and SEM2, by turning on the third transistor T3 and the fourth transistor T4 and applying first and second reference voltages (e.g., predetermined reference voltages) to the first sensing line SSL1$k$ and the second sensing line SSL2$k$, respectively. Therefore, because the pixel PX according to one or more embodiments may detect the current flowing through each light emitting element LD of each sub light emitting unit and predict the number of light emitting elements LD of each sub light emitting unit, the deterioration of the pixel PX may be compensated in consideration of the number of light emitting elements LD in each sub light emitting unit. Accordingly, the luminance uniformity of the pixel unit 100 (refer to FIG. 1) may be improved.

Hereinafter, a method of driving a pixel and a characteristic of the pixel according to one or more embodiments are described with reference to FIGS. 5 to 8.

Figure 5:
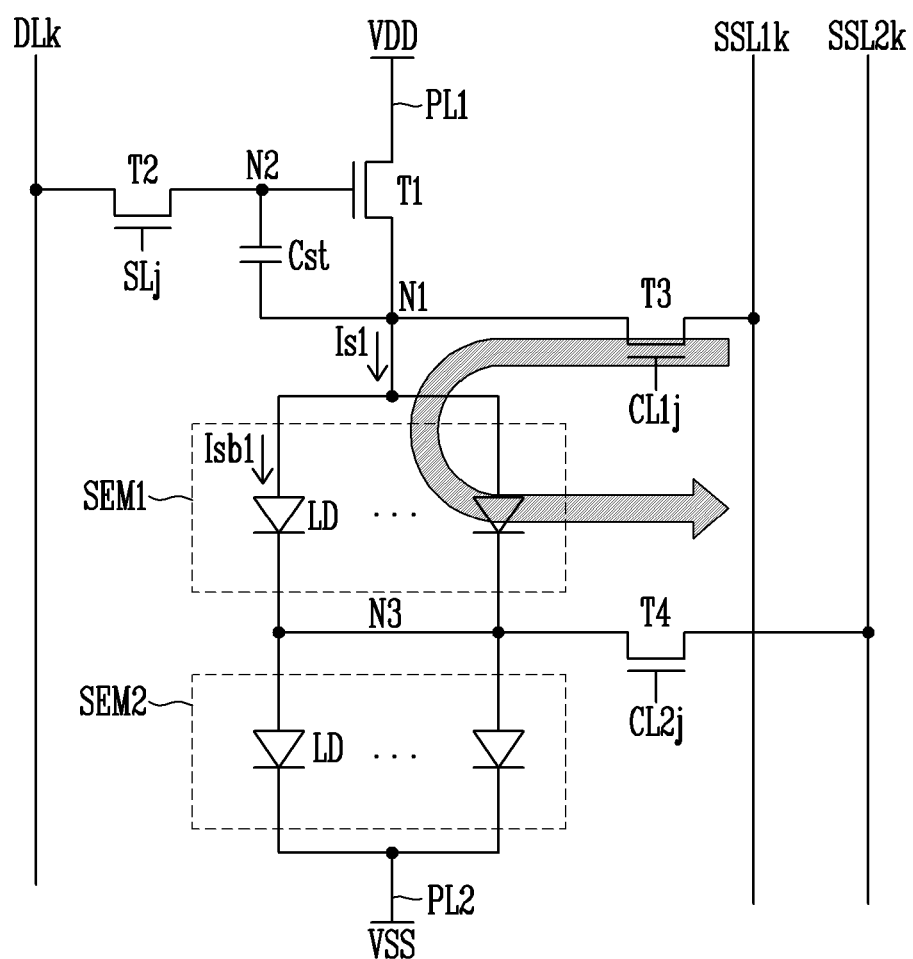
FIG. 5 is a diagram illustrating a path of a current flowing through a first sub light emitting unit of FIG. 4.
Figure 6:
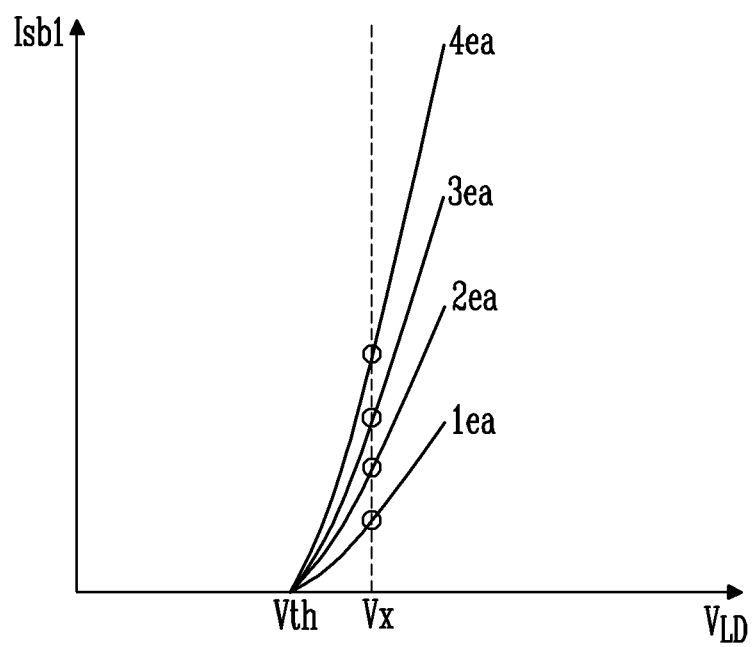
FIG. 6 is a diagram illustrating a relationship between a voltage and a current of a light emitting element included in the first sub light emitting unit of FIG. 5 according to the number of light emitting elements.
Figure 7:
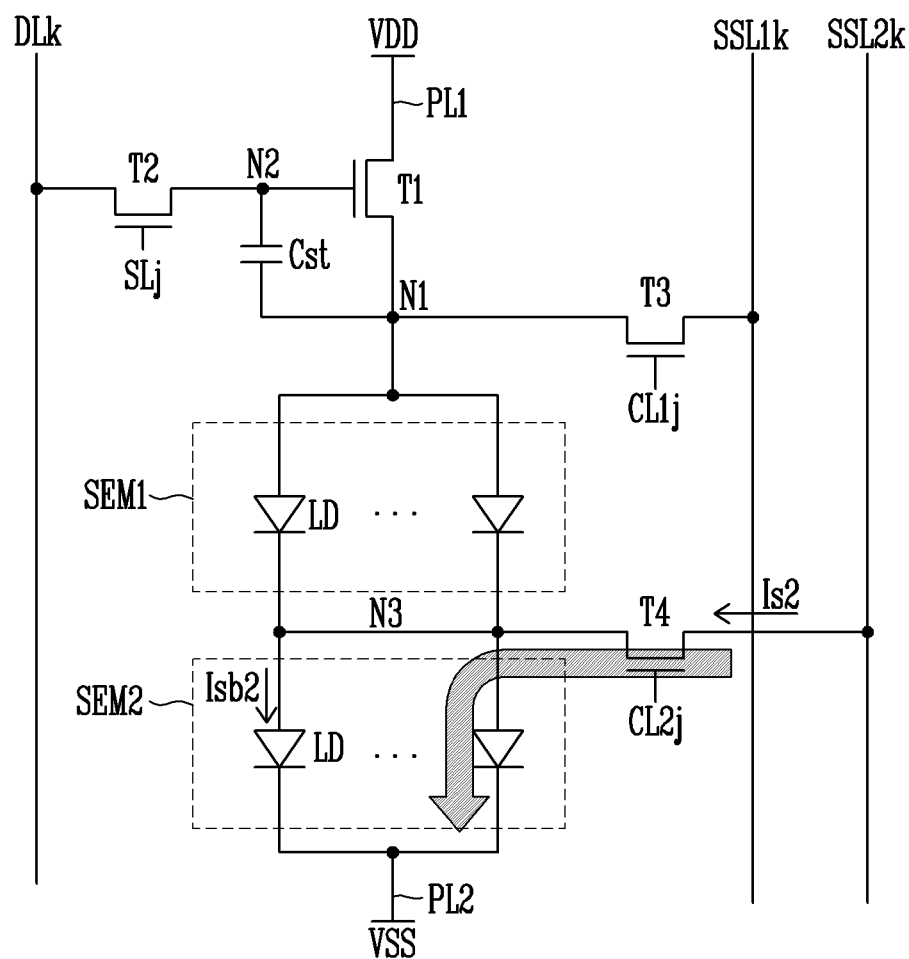
FIG. 7 is a diagram illustrating a path of a current flowing through a second sub light emitting unit of FIG. 4.
Figure 8:
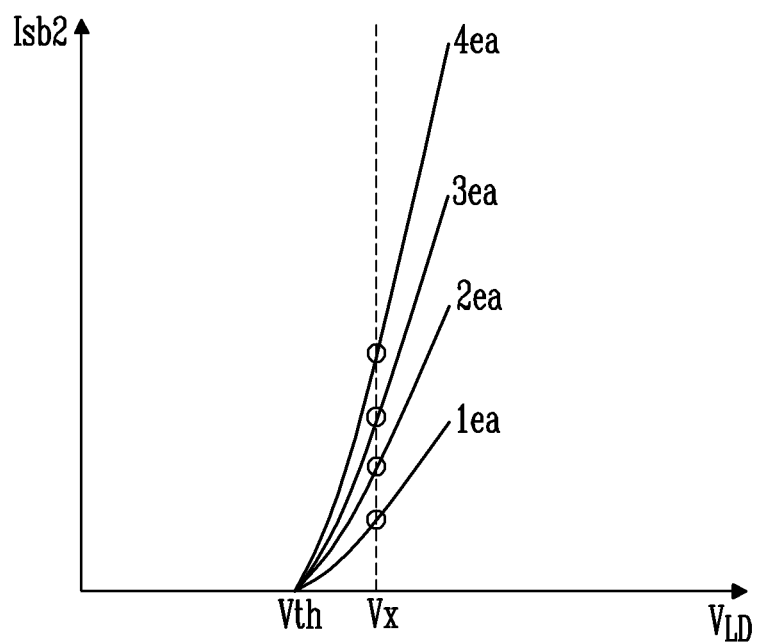
FIG. 8 is a diagram illustrating a relationship between a voltage and a current of a light emitting element included in the second sub light emitting unit of FIG. 7 according to the number of light emitting elements.

FIG. 5 is a diagram illustrating a path of the current flowing through the first sub light emitting unit of FIG. 4, FIG. 6 is a diagram illustrating a relationship between a voltage and a current of the light emitting element included in the first sub light emitting unit of FIG. 5 according to the number of light emitting elements, FIG. 7 is a diagram illustrating a path of the current flowing through the second sub light emitting unit of FIG. 4, and FIG. 8 is a diagram illustrating a relationship between a voltage and a current of the light emitting element included in the second sub light emitting unit of FIG. 7 according to the number of light emitting elements. The method of driving the pixel shown in FIGS. 5 and 7 is for predicting the number of light emitting elements LD connected in parallel in the forward direction included in each sub light emitting unit.

Referring to FIG. 5, in the pixel PX according to one or more embodiments, when the first reference voltage is supplied to the first sensing line SSL1$k$, the second reference voltage is supplied to the second sensing line SSL2$k$, and the third transistor T3 and the fourth transistor T4 are turned on, the number of light emitting elements LD of the first sub light emitting unit SEM1 may be predicted.

The sensing unit 500 (refer to FIG. 1) may supply the first reference voltage to the first sensing line SSL1$k$ and may supply the second reference voltage to the second sensing line SSL2$k$. The first reference voltage may be greater than a threshold voltage of the third transistor T3, and the second reference voltage may be lower than the first reference voltage. For example, the second reference voltage may correspond to a ground voltage, and thus a current may not flow through the second sub light emitting unit SEM2. At this time, the first transistor T1 and the second transistor T2 may be in a turn-off state.

In one or more embodiments, a current path (shown by an arrow) may be formed to pass through the third transistor T3, the first sub light emitting unit SEM1, and the fourth transistor T4 by the first reference voltage applied from the first sensing line SSL1k and the second reference voltage applied from the second sensing line SSL2k. At this time, a first detection current Is1 applied to the first node N1 may be divided and may flow through the light emitting elements LD of the first sub light emitting unit SEM1. The current flowing through each of the light emitting elements LD of the first sub light emitting unit SEM1 may be referred to as a first sub detection current Isb1. Here, the first sub detection current Isb1 may be detected (or measured) by a current sensor or the like commonly used in the art included in the sensing unit 500.

The sensing unit 500 may predict the number of light emitting elements LD of the first sub light emitting unit SEM1 by detecting the first detection current Is1 and the first sub detection current Isb1. That is, the sensing unit 500 may predict the number of light emitting elements LD of the first sub light emitting unit SEM1 with a value obtained dividing the first detection current Is1 by the first sub detection current Isb1. Therefore, the pixel PX according to one or more embodiments may detect the current flowing through each light emitting element LD of each sub light emitting unit, predict the number of light emitting elements LD of each sub light emitting unit, compensate for the deterioration of the pixel PX in consideration of the number of the light emitting elements LD of the sub light emitting unit, and improve the luminance uniformity of the pixel unit 100 (refer to FIG. 1).

Referring to FIG. 6, a magnitude of a voltage generated between the first electrode EU and the second electrode EL2 of the light emitting element LD included in the first sub light emitting unit SEM1 is shown as VLD, and the first sub detection current Isb1 according to a change of the voltage is shown. As the voltage VLD generated between the first electrode EL1 and the second electrode EL2 of the light emitting element LD increases in a range equal to or greater than a threshold voltage Vth, a magnitude of the first sub detection current Isb1 may increase. In addition, as the number of light emitting elements LD increases, the magnitude of the first sub detection current Isb1 may increase as the voltage VLD generated between the first electrode EU and the second electrode EL2 of the light emitting element LD increases. For example, as the number of light emitting elements LD increases to one 1 ea, two 2 ea, three 3 ea, and four 4 ea, the magnitude of the first sub detection current Isb1 may increase.

For example, Vx shown in FIG. 6 may correspond to a difference value between the first reference voltage and the second reference voltage. Accordingly, because the sensing unit 500 knows magnitudes of the first reference voltage and the second reference voltage, the sensing unit 500 may predict the number of light emitting elements LD from the first sub detection current Isb1 detected by the difference value between the first reference voltage and the second reference voltage.

Referring to FIG. 7, in the pixel PX according to one or more embodiments, when the first reference voltage is supplied to the first sensing line SSL1k, the second reference voltage is supplied to the second sensing line SSL2k, and the third transistor T3 and the fourth transistor T4 are turned on, the number of light emitting elements LD of the second sub light emitting unit SEM2 may be predicted.

The sensing unit 500 (refer to FIG. 1) may supply the first reference voltage to the first sensing line SSL1k and may supply the second reference voltage to the second sensing line SSL2k. The second reference voltage may be greater than a threshold voltage of the fourth transistor T4, and the second reference voltage may be equal to the first reference voltage. As the first reference voltage is equal to the second reference voltage, a current may not flow through the first sub light emitting unit SEM1. At this time, the first transistor T1 and the second transistor T2 may be in a turn-off state.

In one or more embodiments, a current path (shown by an arrow) may be formed to pass through the fourth transistor T4 and the second sub light emitting unit SEM2 by the second reference voltage applied from the second sensing line SSL2k and the first reference voltage applied from the first sensing line SSL1k. At this time, the second detection current Is2 applied to the third node N3 may be divided and may flow through the light emitting elements LD of the second sub light emitting unit SEM2. The current flowing through each of the light emitting elements LD of the second sub light emitting unit SEM2 may be referred to as a second sub detection current Isb2. Here, the second sub detection current Isb2 may be detected (or measured) by a current sensor or the like commonly used in the art included in the sensing unit 500.

The sensing unit 500 may determine the second detection current Is2 and the second sub detection current Isb2 to predict the number of light emitting elements LD of the second sub light emitting unit SEM2. That is, the sensing unit 500 may predict the number of light emitting elements LD of the second sub light emitting unit SEM2 with a value obtained by dividing the second detection current Is2 by the second sub detection current Isb2. Therefore, because the pixel PX according to one or more embodiments may detect the current flowing through each light emitting element LD of each sub light emitting unit and predict the number of light emitting elements LD of each sub light emitting unit, the deterioration of the pixel PX may be compensated in consideration of the number of light emitting elements LD in each sub light emitting unit. Accordingly, the luminance uniformity of the pixel unit 100 (refer to FIG. 1) may be improved.

Referring to FIG. 8, the magnitude of the voltage generated between the first electrode EU and the second electrode EL2 of the light emitting element LD included in the second sub light emitting unit SEM2 is shown as VLD, and the second sub detection current Isb2 according to a change of the voltage is shown. As the voltage VLD generated between the first electrode EL1 and the second electrode EL2 of the light emitting element LD increases in a range equal to or greater than the threshold voltage Vth, the magnitude of the second sub detection current Isb2 may increase. In addition, as the number of the light emitting elements LD increases, the magnitude of the second sub detection current Isb2 may increase as the voltage VLD generated between the first electrode EL1 and the second electrode EL2 of the light emitting element LD increases. For example, as the number of light emitting elements LD increases to one 1 ea, two 2 ea, three 3 ea, and four 4 ea, the magnitude of the second sub detection current Isb2 may increase.

For example, Vx shown in FIG. 8 may correspond to a difference value between the second reference voltage and the second driving voltage VSS. Accordingly, because the sensing unit 500 knows magnitudes of the second reference voltage and the second driving voltage VSS, the sensing unit 500 may predict the number of light emitting elements LD from the second sub detection current Isb2 detected by the difference value between the second reference voltage and the second driving voltage VSS.

Hereinafter, various structures of a pixel according to one or more embodiments are described with reference to FIG. 9.

Figure 9:
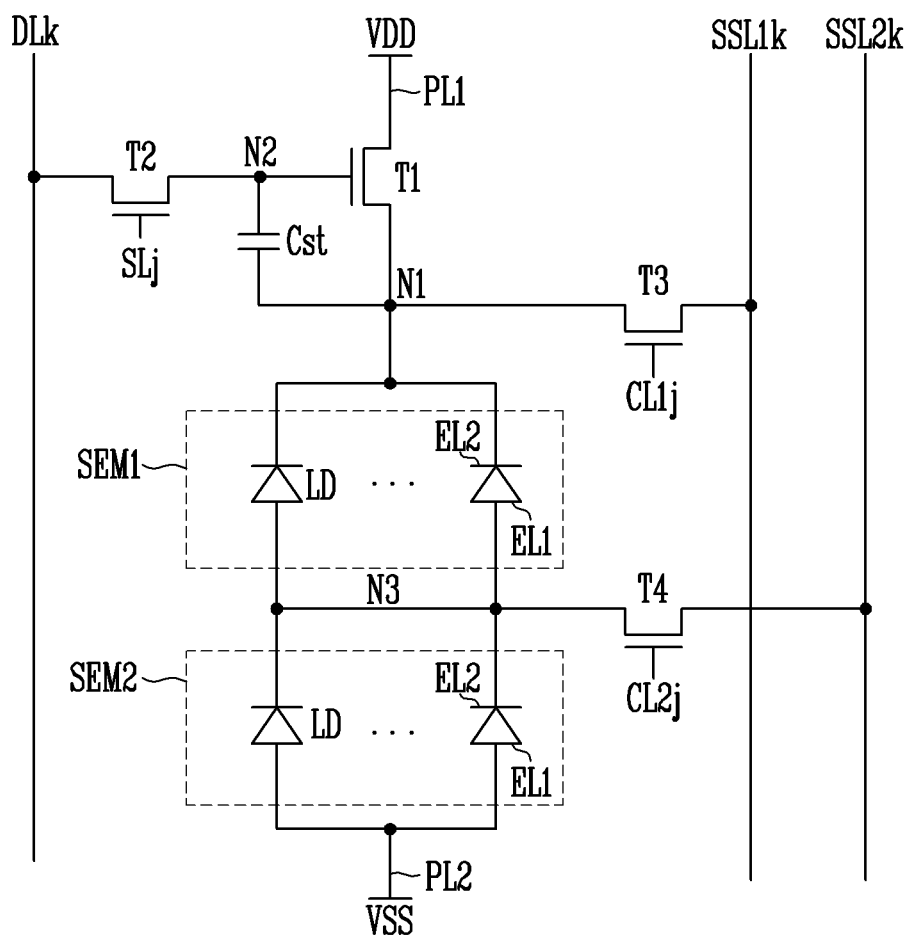
FIG. 9 is a circuit diagram illustrating an example of a pixel according to one or more embodiments.

FIG. 9 is a circuit diagram illustrating an example of a pixel according to an embodiment. Because the circuit diagram shown in FIG. 9 is similar to the circuit diagram shown in FIG. 4, a different point is mainly described below.

Referring to FIG. 9, the pixel PX according to one or more embodiments may include the first transistor T1, the second transistor T2, the third transistor T3, the fourth transistor T4, the storage capacitor Cst, and the light emitting unit EMU.

The light emitting unit EMU may include the first sub light emitting unit SEM1 and the second sub light emitting unit SEM2.

The first sub light emitting unit SEM1 may include the light emitting elements LD connected in parallel between the second electrode EL2 connected to the first node N1 and the first electrode EL1 connected to the third node N3. Here, the first electrode EU may be an anode, and the second electrode EL2 may be a cathode.

The second sub light emitting unit SEM2 may include the light emitting elements LD connected in parallel between the second electrode EL2 connected to the third node N3 and the first electrode EL1 connected to the second driving voltage VSS through the second power line PL2.

In one or more embodiments, the number of light emitting elements LD of the first sub light emitting unit SEM1 and the second sub light emitting unit SEM2 may be predicted by detecting the current flowing through each light emitting element LD of each of the sub light emitting units SEM1 and SEM2. For example, the number of light emitting elements LD of the first sub light emitting unit SEM1 and the second sub light emitting unit SEM2 may be predicted by detecting the current flowing through each light emitting element LD of each of the sub light emitting units SEM1 and SEM2, by turning on the third transistor T3 and the fourth transistor T4 and applying first reference voltage and second reference voltage (e.g., predetermined reference voltages) to the first sensing line SSL1k and the second sensing line SSL2k, respectively. Therefore, because the pixel PX according to one or more embodiments may detect the current flowing through each light emitting element LD of each sub light emitting unit, the number of light emitting elements LD of each sub light emitting unit may be predicted, the deterioration of the pixel may be compensated in consideration of the number of light emitting elements LD of each sub light emitting unit, and the luminance uniformity of the pixel unit 100 (refer to FIG. 1) may be improved.

Hereinafter, a method of driving a pixel according to one or more embodiments is described with reference to FIGS. 10 and 11.

Figure 10:
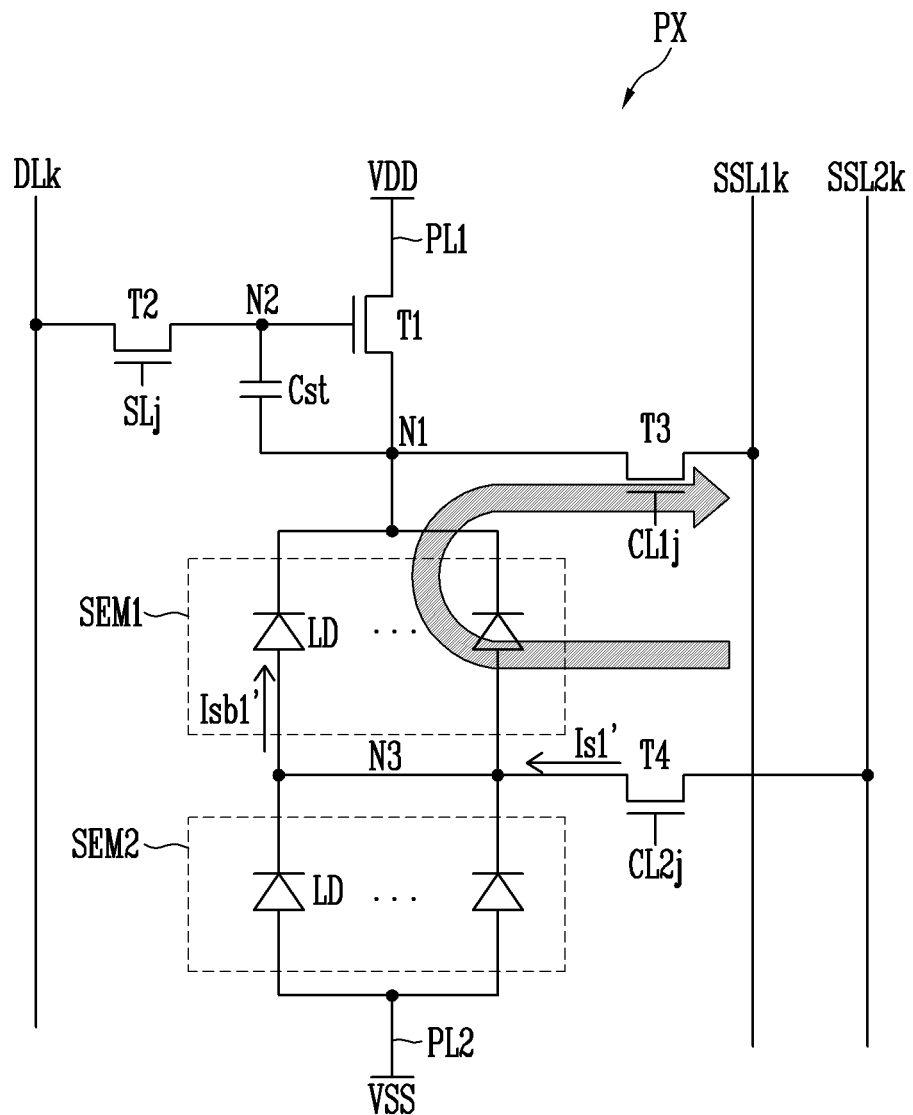
FIG. 10 is a diagram illustrating a path of a current flowing through a first sub light emitting unit of FIG. 9.
Figure 11:
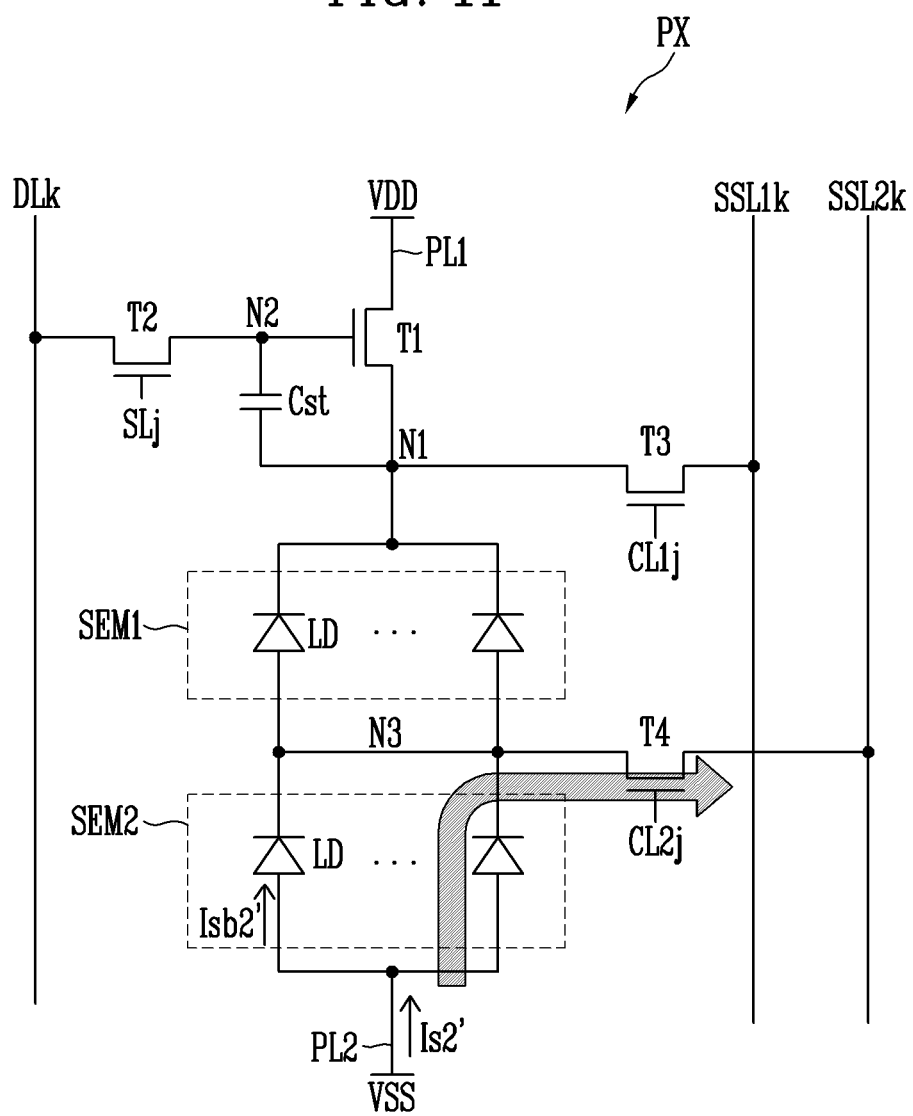
FIG. 11 is a diagram illustrating a path of a current flowing through a second sub light emitting unit of FIG. 9.

FIG. 10 is a diagram illustrating a path of the current flowing through the first sub light emitting unit of FIG. 9, and FIG. 11 is a diagram illustrating a path of the current flowing through the second sub light emitting unit of FIG. 9. The method of driving the pixel shown in FIGS. 10 and 11 is for predicting the number of light emitting elements LD connected in parallel in the reverse direction included in each sub light emitting unit.

Referring to FIG. 10, in the pixel PX according to one or more embodiments, when the first reference voltage is supplied to the first sensing line SSL1k, the second reference voltage is supplied to the second sensing line SSL2k, and the third transistor T3 and the fourth transistor T4 are turned on, the number of light emitting elements LD of the first sub light emitting unit SEM1 may be predicted.

The sensing unit 500 (refer to FIG. 1) may supply the first reference voltage to the first sensing line SSL1k and may supply the second reference voltage to the second sensing line SSL2k. The second reference voltage may be greater than the threshold voltage of the fourth transistor T4, and the first reference voltage may be lower than the second reference voltage. For example, the first reference voltage may correspond to a ground voltage, the second driving voltage VSS may be equal to the second reference voltage, and thus a current may not flow through the second sub light emitting unit SEM2. At this time, the first transistor T1 and the second transistor T2 may be in a turn-off state.

In one or more embodiments, a current path (shown by an arrow) may be formed to pass through the fourth transistor T4, the first sub light emitting unit SEM1, and the third transistor T3, by the second reference voltage applied from the second sensing line SSL2k and the first reference voltage applied from the first sensing line SSL1k. At this time, a first detection current Is1' applied to the third node N3 may be divided and may flow through the light emitting elements LD of the first sub light emitting unit SEM1. The current flowing through each of the light emitting elements LD of the first sub light emitting unit SEM1 may be referred to as a first sub detection current Isb1'.

The sensing unit 500 may predict the number of light emitting elements LD of the first sub light emitting unit SEM1 by detecting the first detection current Is1' and the first sub detection current Isb1'. That is, the sensing unit 500 may predict the number of light emitting elements LD of the first sub light emitting unit SEM1 with a value obtained by dividing the first detection current Is1' by the first sub detection current Isb1'. Therefore, because the pixel PX according to one or more embodiments may detect the current flowing through each light emitting element LD of each sub light emitting unit, the number of light emitting elements LD of each sub light emitting unit may be predicted, the deterioration of the pixel may be compensated in consideration of the number of light emitting elements LD of the sub light emitting unit, and the luminance uniformity of the pixel unit 100 (refer to FIG. 1) may be improved.

Referring to FIG. 11, in the pixel PX according to one or more embodiments, when the first reference voltage is supplied to the first sensing line SSL1k, the second reference voltage is supplied to the second sensing line SSL2k, and the third transistor T3 and the fourth transistor T4 are turned on, the number of light emitting elements LD of the second sub light emitting unit SEM2 may be predicted.

The sensing unit 500 (refer to FIG. 1) may supply the first reference voltage to the first sensing line SSL1k and may supply the second reference voltage to the second sensing line SSL2k. The first reference voltage may be equal to the second reference voltage. For example, the first reference voltage and the second reference voltage may be ground power. As the first reference voltage is equal to the second reference voltage, a current may not flow through the first sub light emitting unit SEM1. At this time, the first transistor T1 and the second transistor T2 may be in a turn-off state.

The voltage supply unit 600 (refer to FIG. 1) may supply the second driving voltage VSS higher than the second reference voltage to the second sub light emitting unit SEM2 through the second power line PL2.

In one or more embodiments, a current path (shown by an arrow) may be formed to pass through the second sub light emitting unit SEM2 and the fourth transistor T4, by the second driving voltage VSS applied from the second power line PL2 and the second reference voltage applied from the second sensing line SSL2k. At this time, the second detection current Is2' applied to the second sub light emitting unit SEM2 may be divided and may flow through the light emitting elements LD of the second sub light emitting unit SEM2. The current flowing through each of the light emitting elements LD of the second sub light emitting unit SEM2 may be referred to as a second sub detection current Isb2'.

The sensing unit 500 may predict the number of light emitting elements LD of the second sub light emitting unit SEM2 by detecting the second detection current Is2' and the second sub detection current Isb2'. That is, the sensing unit 500 may predict the number of light emitting elements LD of the second sub light emitting unit SEM2 with a value obtained by dividing the second detection current Is2' by the second sub detection current Isb2'. Therefore, because the pixel PX according to one or more embodiments may detect the current flowing through each light emitting element LD of each sub light emitting unit, the number of light emitting elements LD of each sub light emitting unit may be predicted, the deterioration of the pixel may be compensated in consideration of the number of light emitting elements LD of each sub light emitting unit, and the luminance uniformity of the pixel unit 100 (refer to FIG. 1) may be improved.

Hereinafter, various structures of a pixel according to one or more embodiments are described with reference to FIG. 12.

Figure 12:
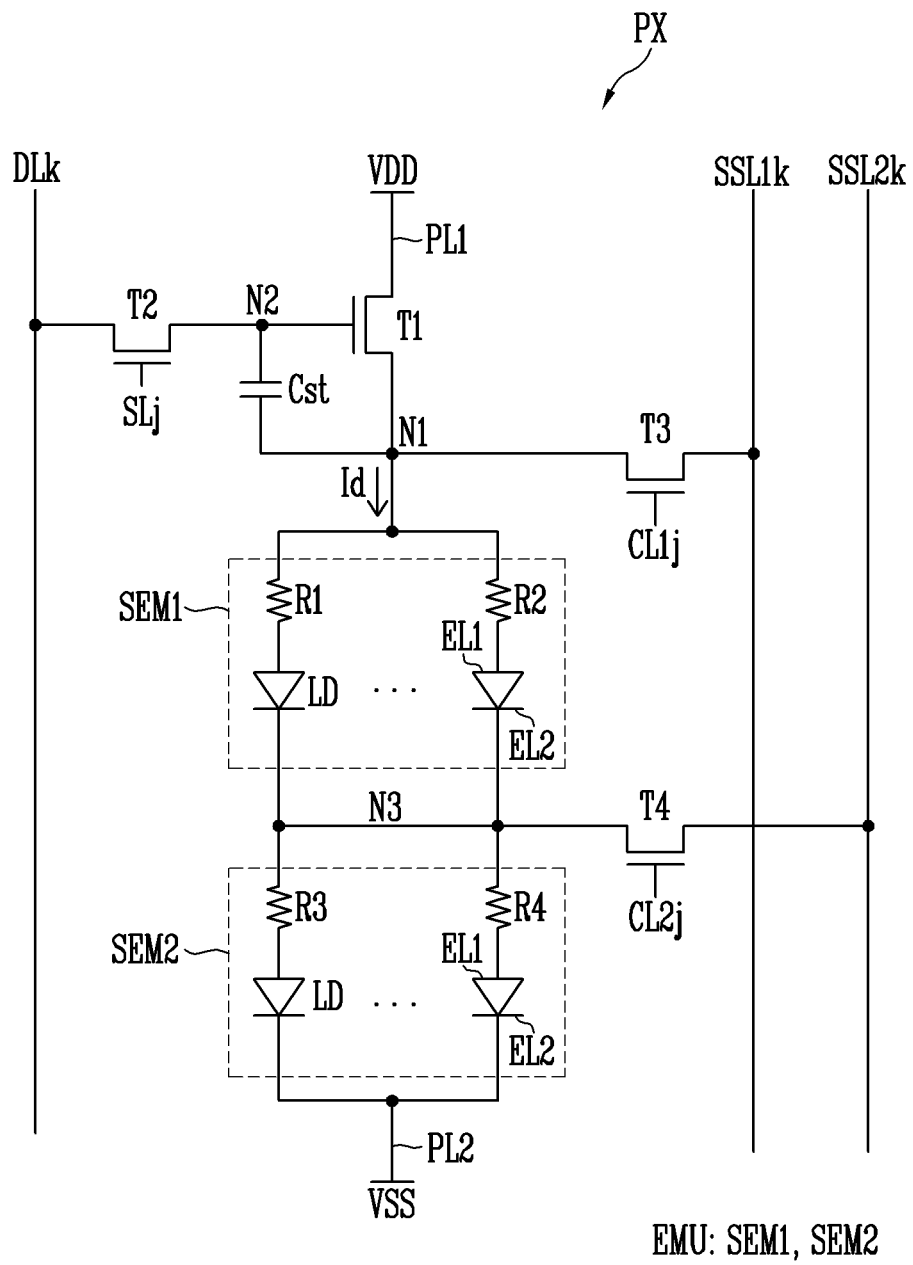
FIG. 12 is a circuit diagram illustrating an example of a pixel according to one or more embodiments.

FIG. 12 is a circuit diagram illustrating an example of a pixel according to one or more embodiments. Because the circuit diagram shown in FIG. 12 is similar to the circuit diagram shown in FIG. 4, a different point is mainly described below.

Referring to FIG. 12, the pixel PX according to one or more embodiments may include the first transistor T1, the second transistor T2, the third transistor T3, the fourth transistor T4, the storage capacitor Cst, and the light emitting unit EMU.

The light emitting unit EMU may include the first sub light emitting unit SEM1 and the second sub light emitting unit SEM2.

The first sub light emitting unit SEM1 may include the light emitting elements LD connected in parallel between the first electrode EL1 connected to the first node N1 and the second electrode EL2 connected to the third node N3, and resistors R1 and R2 connected to each of the light emitting elements LD. Here, the first electrode EL1 may be an anode and the second electrode EL2 may be a cathode, but the present disclosure is not limited thereto. According to one or more embodiments, the first electrode EU may be a cathode, and the second electrode EL2 may be an anode.

The second sub light emitting unit SEM2 may include the light emitting elements LD connected in parallel between the first electrode EL1 connected to the third node N3 and the second electrode EL2 connected to the second driving voltage VSS through the second power line PL2, and resistors R3 and R4 connected to each of the light emitting elements LD.

Each of the resistors R1, R2, R3, and R4 may be connected between the first electrode EL1 of the light emitting element LD and the first node N1. For example, in one or more embodiments, the resistors R1 and R2 may be connected between the first electrode EL1 of the light emitting element LD of the first sub light emitting unit SEM1 and the first node N1 and the resistors R3 and R4 may be connected between the first electrode EL1 of the light emitting element LD of the second sub light emitting unit SEM2 and the second node N2. All sizes of the resistors R1, R2, R3, and R4 may be the same as or different from each other. In one or more embodiments, by including the resistors R1, R2, R3, and R4 in the first sub light emitting unit SEM1 and the second sub light emitting unit SEM2, overcurrent that may occur due to short of at least one light emitting element LD of the first sub light emitting unit SEM1 may be prevented.

Accordingly, in one or more embodiments, the number of light emitting elements LD of the first sub light emitting unit SEM1 may be predicted while preventing overcurrent.

The pixel PX of FIG. 12 only further includes the resistors R1, R2, R3, and R4 compared to the pixel PX of FIG. 4, and a driving method for predicting the number of light emitting elements LD of the first sub light emitting unit SEM1 and the second sub light emitting unit SEM2 is the same as the method shown in FIGS. 5 and 7.

Hereinafter, various structures of a pixel according to one or more embodiments are described with reference to FIG. 13.

Figure 13:
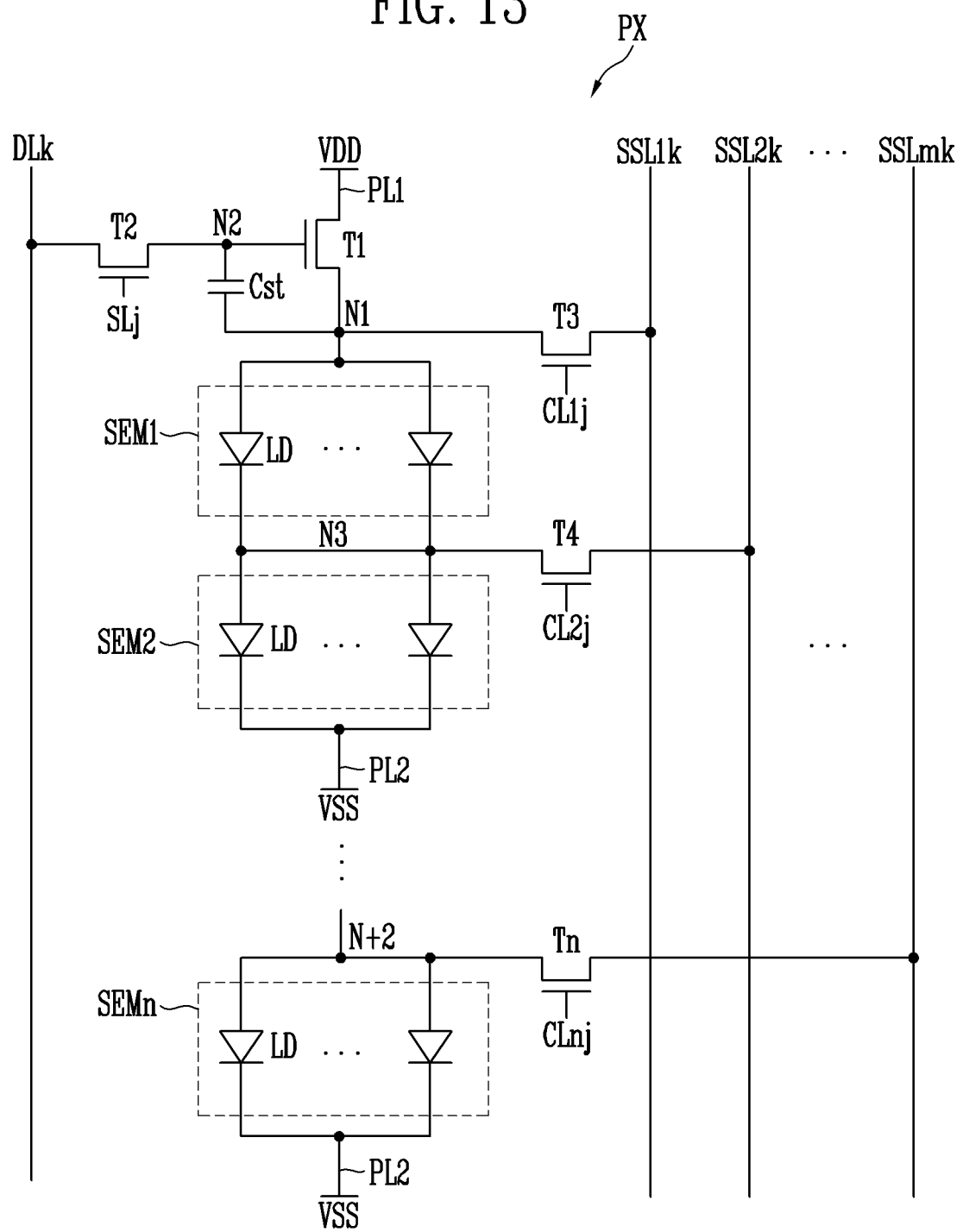
FIG. 13 is a circuit diagram illustrating an example of a pixel according to one or more embodiments.

FIG. 13 is a circuit diagram illustrating an example of a pixel according to one or more embodiments. Because the circuit diagram shown in FIG. 13 is similar to the circuit diagram shown in FIG. 4, a different point (e.g., the difference between the described embodiments) is mainly described below.

Referring to FIG. 13, the pixel PX according to one or more embodiments may include the first transistor T1, the second transistor T2, the third transistor T3, the fourth to n-th transistors T4 to Tn, the storage capacitor Cst, and the light emitting unit EMU.

The light emitting unit EMU may include at least one sub light emitting unit. For example, the light emitting unit EMU may include the first sub light emitting unit SEM1, and second to n-th sub light emitting units SEM2 to SEMn.

A first electrode of the n-th transistor Tn may be connected to an m-th sensing line SSLmk, a second electrode may be connected to an (n+2)-th node N+2, and a gate electrode of the n-th transistor Tn may be connected to an n-th control line CLnj. The n-th transistor Tn may be turned on when an n-th control signal (for example, a high level voltage) is supplied to the n-th control line CLnj during a sensing period (e.g., a predetermined sensing period), to electrically connect the m-th sensing line SSLmk and the (n+2)-th node N+2.

When a reference voltage (e.g., a predetermined reference voltage) is supplied to the pixel PX according to one or more embodiments by a sensing line (or the sensing line and the second power line PL2) connected to each sub light emitting unit, the number of light emitting elements of each sub light emitting unit may be predicted. For example, the n-th sub light emitting unit SEMn may be connected to the second power line PL2 and the m-th sensing line SSLmk, and the second reference voltage equal to the first reference voltage applied to another sensing line (for example, a first sensing line SSL1 and a second sensing line SSL2) may be applied to the m-th sensing line SSLmk. As the first reference voltage is equal to the second reference voltage, a current may not flow through a remaining sub light emitting unit, and a detection current may flow through the n-th sub light emitting unit SEMn by the second driving voltage VSS lower than the second reference voltage. At this time, the sensing unit 500 (refer to FIG. 1) may detect the detection current flowing through the n-th sub light emitting unit SEMn and the sub detection current flowing through each light emitting element LD of the n-th sub light emitting unit SEMn to predict the number of light emitting elements LD of the n-th sub light emitting unit SEMn. Therefore, because the pixel PX according to one or more embodiments may detect the current flowing through each light emitting element LD of each sub light emitting unit and predict the number of light emitting elements LD of each sub light emitting unit, the deterioration of the pixel PX may be compensated in consideration of the number of light emitting elements LD in each sub light emitting unit. Accordingly, the luminance uniformity of the pixel unit 100 (refer to FIG. 1) may be improved.

Hereinafter, a pixel according to one or more embodiments is described with reference to FIG. 14.

Figure 14:
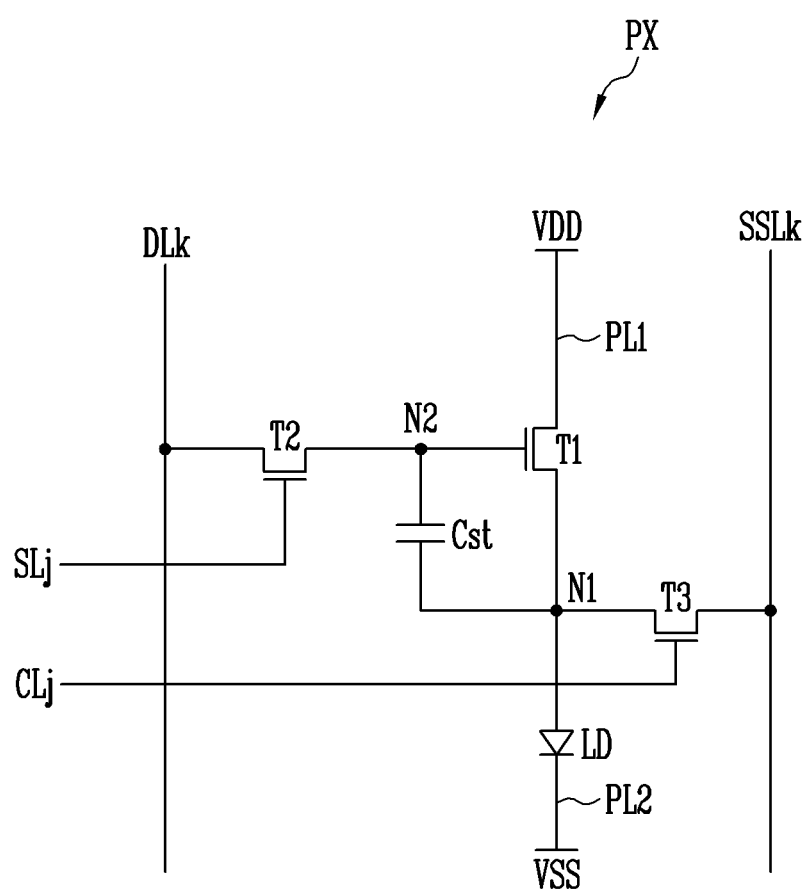
FIG. 14 is a circuit diagram illustrating an example of a pixel according to one or more embodiments.

FIG. 14 is a circuit diagram illustrating an example of a pixel according to one or more embodiments. FIG. 14 may correspond to another example of the pixel included in the display device of FIG. 1.

Referring to FIG. 14, the pixel PX may include the light emitting element LD, the first transistor T1 (e.g., the driving transistor), the second transistor T2 (e.g., the switching transistor), the third transistor T3, and the storage capacitor Cst.

The first electrode (e.g., anode or cathode) of the light emitting element LD is connected to the first node N1 and the second electrode (e.g., cathode or anode) is connected to the second driving voltage VSS through the second power line PL2. The light emitting element LD generates light of a desired luminance (e.g., a predetermined luminance) in response to a current amount supplied from the first transistor T1.

The first electrode of the first transistor T1 may be connected to the first driving voltage VDD through the first power line PL1, and the second electrode may be connected the first electrode (or the first node N1) of the light emitting element LD. The gate electrode of the first transistor T1 may be connected to the second node N2. The first transistor T1 may control the current amount flowing to the light emitting element LD in response to the voltage of the second node N2.

The first electrode of the second transistor T2 may be connected to the data line DLk, and the second electrode may be connected to the second node N2. The gate electrode of the second transistor T2 may be connected to the scan line SLj. The second transistor T2 may be turned on when the scan signal is supplied to the scan line SLj to transmit the data signal from the data line DLk to the second node N2.

The third transistor T3 may be connected between the sensing line SSLk and the second electrode (that is, the first node N1) of the first transistor T1. That is, the first electrode of the third transistor T3 may be connected to the sensing line SSLk, the second electrode may be connected to the second electrode of the first transistor T1, and the gate electrode of the third transistor T3 may be connected to the control line CLj. The third transistor T3 may be turned on when a control signal is supplied to the control line CLj, to electrically connect the sensing line SSLk and the first node N1 (that is, the second electrode of the first transistor T1).

The storage capacitor Cst may be connected between the first node N1 and the second node N2. The storage capacitor Cst may store a voltage corresponding to a voltage difference between the first node N1 and the second node N2.

In one or more embodiments of the present disclosure, a circuit structure of the pixel PX is not limited by FIG. 14. For example, the light emitting element LD may be positioned between the first power line PL1 and the first electrode of the first transistor T1. In addition, a parasitic capacitor may be formed between the gate electrode and the drain electrode of the first transistor T1.

Although the transistors T1, T2, and T3 are shown as NMOS in FIG. 14, the present disclosure is not limited thereto. For example, at least one of the transistors T1, T2, and T3 may be formed as a PMOS. In addition, the transistors T1, T2, and T3 shown in FIG. 14 may be thin film transistors including at least one of an oxide semiconductor, an amorphous silicon semiconductor, and a polycrystalline silicon semiconductor.

Figure 15:
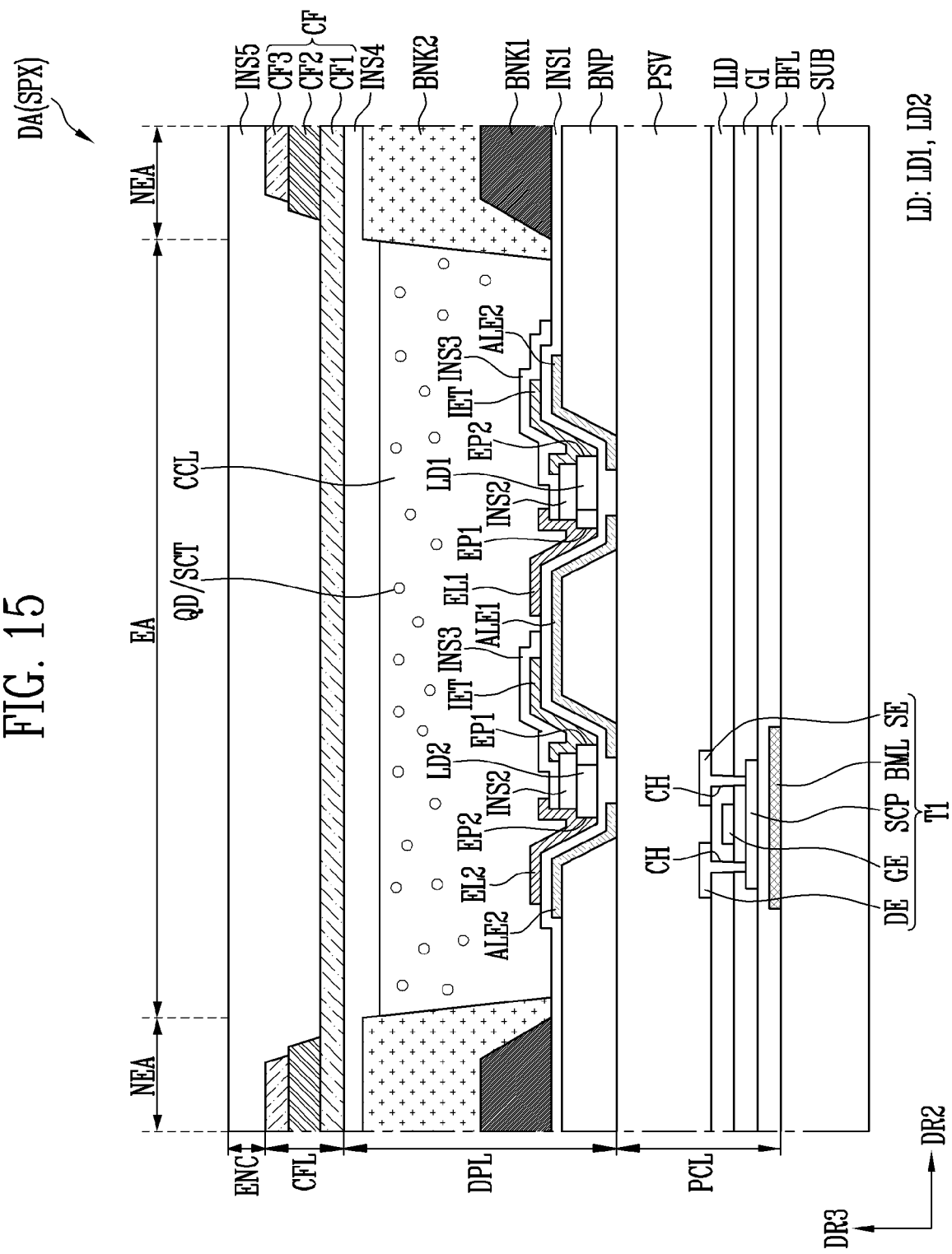
FIGS. 15 and 16 are cross-sectional views illustrating examples of a sub-pixel disposed in a display area of FIG. 2.
Figure 16:
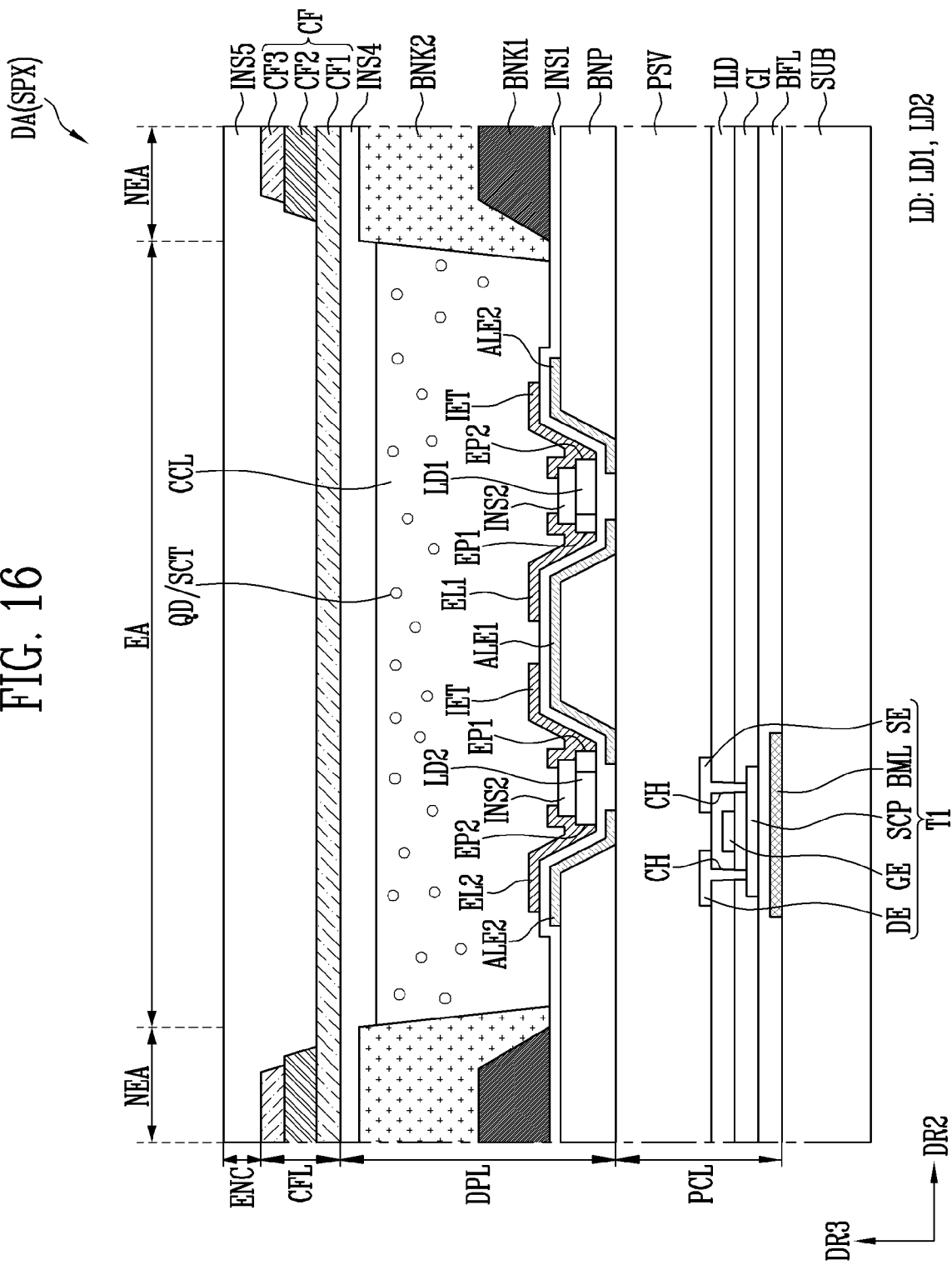

Hereinafter, the pixel structure shown in FIG. 14 is described with reference to FIGS. 15 and 16. FIGS. 15 and 16 show a case in which one light emitting element LD shown in FIG. 14 is connected as a plurality of light emitting elements, and show a case in which an intermediate electrode positioned between the first electrode EL1 and the second electrode EL2 is further included.

FIGS. 15 and 16 are cross-sectional views illustrating examples of a sub-pixel disposed in the display area DA of FIG. 2. Here, a sub-pixel SPX may correspond to any one of the first sub-pixel SPX1 (refer to FIG. 2), the second sub-pixel SPX2 (refer to FIG. 2), and the third sub-pixel SPX3 (refer to FIG. 2).

Referring to FIGS. 15 and 16, a display device according to one or more embodiments may include a substrate SUB, a pixel circuit layer PCL disposed on the substrate SUB, and a display layer DPL. In addition, the display device may further include a color filter layer CFL and/or an encapsulation layer ENC disposed on the display layer DPL.

The substrate SBU may be a rigid substrate, or a flexible substrate or film, and a material or a structure thereof is not particularly limited. For example, the substrate SBU may include at least one transparent or opaque insulating material, and may be a substrate or film of a single layer or multiple layers.

The pixel circuit layer PCL may include circuit elements configuring a pixel circuit of each pixel PX. For example, the pixel circuit layer PCL may include the first transistor T1, the second transistor T2, the third transistor T3, the fourth transistor T4, and the storage capacitor Cst shown in FIG. 4.

In addition, the pixel circuit layer PCL may include various signal lines and power lines connected to the circuit elements. For example, the pixel circuit layer PCL may include the scan lines SL1 to SLn, the first control lines CL11 to CL1n, the second control lines CL21 to CL2n, the data lines DL1 to DLm, the first sensing lines SSL11 to SSL1m, the second sensing lines SSL21 to SSL2m shown in FIG. 1, and the first and second power lines PL1 and PL2 (refer to FIG. 4).

The pixel circuit layer PCL may include a plurality of insulating layers. For example, the pixel circuit layer PCL may include a buffer layer BFL, a gate insulating layer GI, an interlayer insulating layer ILD, and/or a passivation layer PSV sequentially disposed on the substrate SUB.

The pixel circuit layer PCL may include a lower metal layer (or a bottom metal layer) BML disposed on the substrate SUB. The lower metal layer BML may be positioned between the substrate SUB and the buffer layer BFL and may overlap a gate electrode GE and a semiconductor pattern SCP of the first transistor T1 in a thickness direction of the substrate SUB (e.g., a third direction DR3).

The buffer layer BFL may be disposed on the lower metal layer BML to cover the substrate SUB and the lower metal layer BML. The buffer layer BFL is for preventing an impurity from diffusing into the circuit element, may include various types of inorganic insulating materials including silicon nitride ($SiN_x$), silicon oxide ($SiO_x$), silicon oxynitride ($SiO_xN_y$), or the like, and may include an organic insulating material.

The semiconductor pattern SCP may be disposed on the buffer layer BFL.

The semiconductor pattern SCP may include a channel area overlapping the gate electrode GE of the first transistor T1, and a source area and a drain area disposed on both sides of the channel area. The semiconductor pattern SCP may be formed of polysilicon, amorphous silicon, an oxide semiconductor, or the like.

The gate insulating layer GI may be disposed on the semiconductor pattern SCP and the buffer layer BFL. The gate insulating layer GI may include various types of inorganic insulating materials including silicon nitride ($SiN_x$), silicon oxide ($SiO_x$), silicon oxynitride ($SiO_xN_y$), or the like, and may include an organic insulating material.

The gate electrode GE of the first transistor T1 may be positioned on the gate insulating layer GI.

The interlayer insulating layer ILD may be disposed on the gate insulating layer GI and the gate electrode GE. The interlayer insulating layer ILD may include various types of inorganic insulating materials including silicon nitride ($SiN_x$), silicon oxide ($SiO_x$), silicon oxynitride ($SiO_xN_y$), or the like, and may include an organic insulating material.

A source electrode SE and a drain electrode DE of the first transistor T1 may be positioned on the interlayer insulating layer ILD. The source electrode SE and the drain electrode DE may be respectively connected to the source area and the drain area of the semiconductor pattern SCP through a contact hole CH.

The passivation layer PSV may be disposed on the source electrode SE and the drain electrode DE of the first transistor T1 and the interlayer insulating layer ILD. The passivation layer PSV may include an organic insulating material and may planarize a surface of the pixel circuit layer PCL.

The display layer DPL may be disposed on the passivation layer PSV.

The display layer DPL may include a first alignment electrode ALE1, a second alignment electrode AEL2, the light emitting element LD, the first electrode EL1, the second electrode EL2, and an intermediate electrode IET disposed in the emission area EA of the sub-pixel SPX.

In addition, the display layer DPL may include bank patterns BNP, a first insulating layer INS1, a first bank BNK1, a second insulating layer INS2, a third insulating layer INS3, a second bank BNK2, and a fourth insulating layer INS4, and may selectively further include a light conversion layer CCL.

The bank patterns BNP (also referred to as "patterns" or "wall patterns") may be disposed on the passivation layer PSV. The bank patterns BNP may have openings or recesses corresponding each area (for example, a light emitting element arrangement area where light emitting elements configuring each series stage of the light emitting unit EMU (refer to FIG. 4) are arranged) where the light emitting elements LD are arranged, so as to be around (e.g., surround) at least one more light emitting elements LD disposed in an emission area EA of the sub-pixel SPX. The bank patterns BNP may include an inorganic insulating layer formed of an inorganic material or an organic insulating layer formed of an organic material.

The first alignment electrode ALE1 and the second alignment electrode ALE2 may be disposed on the bank patterns BNP.

The first and second alignment electrodes ALE1 and ALE2 may include at least one conductive material. For example, the first and second alignment electrodes ALE1 and ALE2 may include at least one conductive material from among at least one metal from among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, an alloy thereof, a conductive oxide such as indium tin oxide (ITO), indium zinc oxide (IZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and fluorine doped tin oxide (FTO), and a conductive polymer such as PEDOT, but are not limited thereto.

The first insulating layer INS1 may be disposed on the first and second alignment electrodes ALE1 and ALE2. The first insulating layer INS1 may include at least one type of inorganic insulating material including silicon nitride ($SiN_x$), silicon oxide ($SiO_x$), or silicon oxynitride ($SiO_xN_y$).

The first bank BNK1 may be disposed on the display area DA in which the first and second alignment electrodes ALE1 and ALE2 and the first insulating layer INS1 are disposed.

The first bank BNK1 may have an opening corresponding to the emission area EA of the sub-pixel SPX and may be provided in a non-emission area NEA to surround the emission area EA. Accordingly, the emission area EA to which the light emitting elements LD are supplied may be defined (or partitioned). In one or more embodiments, the first bank BNK1 may include a light blocking material including a black matrix material or the like, and/or a reflective material.

The light emitting element LD may be supplied to the emission area EA.

The light emitting element LD may be arranged in a second direction DR2, a diagonal direction, or the like so that a first end EP1 faces (e.g., opposes) the first alignment electrode ALE1 and a second end EP2 faces (e.g., opposes) the second alignment electrodes ALE2. In addition, the light emitting element LD may include a first light emitting element LD1 and a second light emitting element LD2.

The second insulating layer INS2 may be disposed on a portion of the light emitting elements LD. For example, the second insulating layer INS2 may be disposed on a portion including a central portion of the light emitting element LD to expose the first and second ends EP1 and EP2 of the light emitting element LD aligned in the emission area EA of the sub-pixel SPX. The second insulating layer INS2 may include various types of inorganic or organic insulating materials including silicon nitride ($SiN_x$), silicon oxide ($SiO_x$), silicon oxynitride ($SiO_xN_y$), aluminum oxide ($Al_xO_y$), a photoresist (PR) material, and the like.

Different electrodes from among the first electrode EL1, the second electrode EL2, and the intermediate electrode IET may be formed on the first and second ends EP1 and EP2 of the light emitting element LD. For example, the first electrode EU may be disposed on the first end EP1 of the first light emitting element LD1, and the intermediate electrode IET may be disposed on the second end EP2 of the first light emitting element LD1. The intermediate electrode IET may be disposed on the first end EP1 of the second light emitting element LD2, and the second electrode EL2 may be disposed on the second end EP2 of the second light emitting element LD2.

The first electrode EL1 may be disposed on the first alignment electrode ALE1 to overlap a portion of the first alignment electrode ALE1, and the second electrode EL2 may be disposed on the second alignment electrode ALE2 to overlap a portion of the second alignment electrode ALE2. The intermediate electrode IET may be disposed on the first alignment electrode ALE1 and the second alignment electrode ALE2 to overlap another portion of each of the first alignment electrode ALE1 and the second alignment electrode ALE2.

The first electrode EL1, the second electrode EL2, and/or the intermediate electrode IET may be formed on (e.g., at) the same or different layers. For example, a mutual position, and/or a formation order of the first electrode EL1, the second electrode EL2, and the intermediate electrode IET may be variously changed according to one or more embodiments.

In the embodiment of FIG. 15, the intermediate electrode IET may be first formed on the second insulating layer INS2. The intermediate electrode IET may be in direct contact with the second end EP2 of the first light emitting element LD1 and the first end EP1 of the second light emitting element LD2, and thus may be connected between the first light emitting element LD1 and the second light emitting element LD2, but the present disclosure is not limited thereto. Thereafter, the third insulating layer INS3 may be formed in the emission area EA to cover the intermediate electrode IET, and the first electrode EL1 and the second electrode EL2 may be formed. The first electrode EU and the second electrode EL2 may be formed concurrently (e.g., simultaneously or sequentially). The first electrode EL1 may be connected to the first end EP1 of the first light emitting element LD1 by directly contacting the first end EP1 of the first light emitting element LD1, and the second electrode EL2 may be connected to the second end EP2 of the second light emitting element LD2 by directly contacting the second end EP2 of the second light emitting element LD2, but the present disclosure is not limited thereto.

In the embodiment of FIG. 16, the first electrode ELT1, the second electrode ELT2, and the intermediate electrode IET may be disposed in the same layer of the display layer DPL, and may be formed concurrently (e.g., simultaneously or sequentially). In this case, the third insulating layer INS3 may be omitted. In the embodiment of FIG. 16, when the electrodes disposed on the first end EP1 and the second end EP2 of the light emitting element LD are concurrently (e.g., simultaneously) formed in the same layer, a pixel process may be simplified and manufacturing efficiency may be increased.

The display layer DPL may further include the second bank BNK2 disposed in the non-emission area NEA to overlap the first bank BNK1. The second bank BNK2 may define (or partition) the emission area EA in which the light conversion layer CCL is to be formed. In one or more embodiments, the second bank BNK2 may be integrated with the first bank BNK1.

The second bank BNK2 may include a light blocking material including a black matrix material or the like, and/or a reflective material. The second bank BNK2 may include a material identical to or different from that of the first bank BNK1.

The light conversion layer CCL may be disposed in the emission area EA.

The light conversion layer CCL may include wavelength conversion particles (or color conversion particles) that convert a wavelength and/or a color of the light emitted from the light emitting element LD, and/or light scattering particles SCT that increase light output efficiency by scattering the light emitted from the light emitting elements LD. For example, on each sub-pixel SPX, each light conversion layer CCL including the wavelength conversion particles including at least one type of quantum dot QD (for example, a red quantum dot, a green quantum dot, and/or a blue quantum dot), and/or the light scattering particles SCT may be provided. For example, when any one sub-pixel SPX is set as a red (or green) sub-pixel, and blue light emitting elements LD are provided, on the sub-pixel SPX, the light conversion layer CCL including the red (or green) quantum dot QD for converting blue light into red (or green) light may be disposed. In addition, the light conversion layer CCL may further include the light scattering particles SCT.

The fourth insulating layer INS4 may be disposed on the substrate SUB including the light conversion layer CCL of the sub-pixel SPX. In one or more embodiments, the fourth insulating layer INS4 may include an organic and/or inorganic insulating layer, and may substantially planarize a surface of the display layer DPL.

The color filter layer CFL may be disposed on the fourth insulating layer INS4.

The color filter layer CFL may include color filters CF corresponding to a color of the sub-pixel SPX. For example, the color filter layer CFL may include a first color filter CF1 disposed on the first sub-pixel SPX1, a second color filter CF2 disposed on the second sub-pixel SPX2, and a third color filter CF3 disposed on the third sub-pixel SPX3.

In one or more embodiments, the first, second, and third color filters CF1, CF2, and CF3 may be disposed to overlap each other in the non-emission area NEA to block light interference between the sub-pixels SPX. In one or more embodiments, the first, second, and third color filters CF1, CF2, and CF3 may be formed separately from each other in each sub-pixel, and a separate light blocking pattern or the like may be disposed between the first, second, and third color filters CF1, CF2, and CF3.

The encapsulation layer ENC may be disposed on the color filter layer CFL. The encapsulation layer ENC may include at least one organic and/or inorganic insulating layer including a fifth insulating layer INS5. The fifth insulating layer INS5 may be entirely formed in the display area DA to cover the pixel circuit layer PCL, the display layer DPL, and/or the color filter layer CFL.

The fifth insulating layer INS5 may be configured as a single layer or multiple layers, and may include at least one inorganic insulating material and/or organic insulating material. For example, the fifth insulating layer INS5 may include various types of inorganic insulating materials including silicon nitride ($SiN_x$), silicon oxide ($SiO_x$), silicon oxynitride ($SiO_xN_y$), or aluminum oxide ($Al_xO_y$), and may include an organic insulating material.

In one or more embodiments, the fifth insulating layer INS5 may be formed as multiple layers. For example, the fifth insulating layer INS5 may include at least two inorganic insulating layers and at least one organic insulating layer interposed between the at least two inorganic insulating layers. However, a configuration material and/or a structure of the fifth insulating layer INS5 may be variously changed. In addition, according to one or more embodiments, at least one overcoat layer, a filler layer, an upper substrate, and/or the like may be further disposed on the fifth insulating layer INS5.

Figure 17:
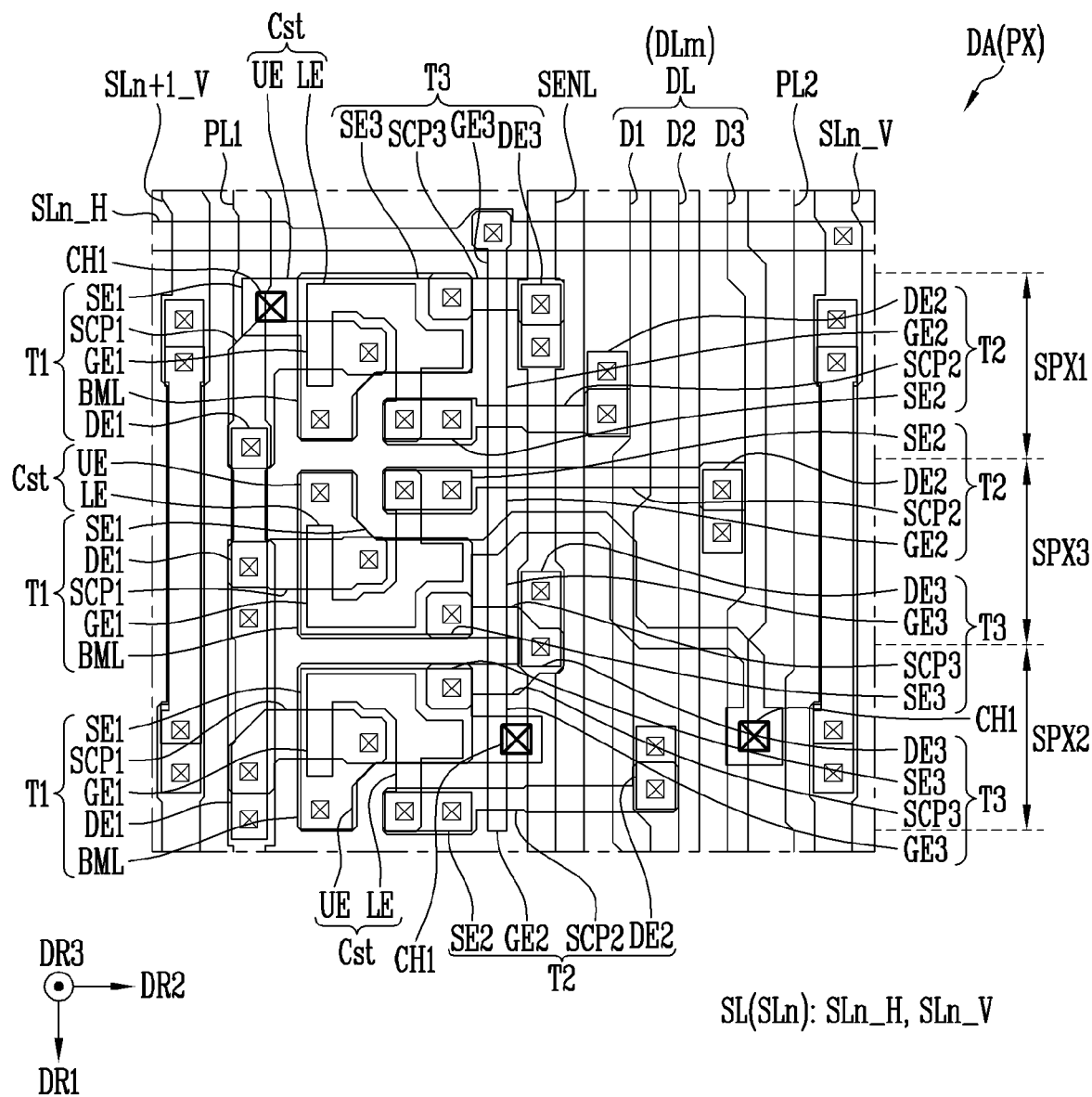
FIG. 17 is a plan view illustrating an example of a pixel disposed in the display area of FIG. 2.

FIG. 17 is a plan view illustrating an example of a pixel disposed in the display area DA of FIG. 2. In FIG. 17, contact holes electrically connecting the semiconductor pattern and the source electrode, and electrically connecting the semiconductor pattern and the drain electrode are not denoted by reference numerals, and are shown as a rectangle in which X is included.

Referring to FIG. 17, a pixel PX may include the first sub-pixel SPX1, the second sub-pixel SPX2, and the third sub-pixel SPX3. For example, the first sub-pixel SPX1, the second sub-pixel SPX2, and the third sub-pixel SPX3 may be disposed adjacent to each other in a first direction DR1.

The pixel PX may include a scan line SL, a data line DL, a sensing line SENL, and first and second power lines PL1 and PL2. In one or more embodiments, a control line CL may be integrated with the scan line SL of a corresponding horizontal line.

The scan line SL may include a plurality of sub scan lines each extending in the first direction DR1 and the second direction DR2 in the display area DA. For example, an n-th scan line SLn may include a first sub scan line SLn_H disposed in an n-th horizontal line of the display area DA and extending along the second direction DR2, and a second sub scan line SLn_V extending along the first direction DR1 in the display area DA to cross the first sub scan line SLn_H and connected to the first sub scan line SLn_H. In addition, a second sub scan line SLn+1_V from among scan lines disposed in an (n+1)-th horizontal line of the display area DA may cross the first sub scan line SLn_H.

The data line DL may extend along the first direction DR1 in the display area DA. The data line DL may include a plurality of sub data lines individually connected to sub-pixels SPX configuring each pixel PX. For example, an m-th data line DLm may include a first sub data line D1 connected to the first sub-pixels SPX1 of the pixels PX disposed in an m-th vertical line, a second sub data line D2 connected to the second sub-pixels SPX2 of the pixels PX disposed in the m-th vertical line, and a third sub data line D3 connected to the third sub-pixels SPX3 of the pixels PX disposed in the m-th vertical line. Accordingly, a data signal may be individually supplied to each sub-pixel SPX.

The sensing line SENL may extend along the first direction DR1 in the display area DA and may be formed for at least one vertical line. In one or more embodiments, the sensing line SENL may be formed for each vertical line and may be commonly connected to the sub-pixels SPX configuring each pixel PX. In this case, characteristics of each pixel PX may be individually detected.

The first power line PL1 and the second power line PL2 may be commonly connected to the pixels PX of the display area DA.

For example, the first power line PL1 may extend in the first direction DR1. In addition, in one or more embodiments, the first power line PL1 may further include a first sub power line extending in the second direction DR2. The first sub power line may cross the first power line PL1 and may be connected to each other at all cross points or some cross points.

The second power line PL2 may extend in the first direction DR1. In addition, in one or more embodiments, the second power line PL2 may further include a second sub power line extending in the second direction DR2. The second sub power line may cross the second power line PL2 and may be connected to each other at all cross points or some cross points.

Each of the sub-pixels may include the first transistor T1, the second transistor T2, the third transistor T3, and the storage capacitor Cst.

The first transistor T1 of each sub-pixel may include a first semiconductor pattern SCP1, a first gate electrode GE1, a first source electrode SE1, and a first drain electrode DE1. In addition, the first transistor T1 of each sub-pixel may further include a lower metal layer BML overlapping the first gate electrode GE1.

The first semiconductor pattern SCP1 may overlap the first gate electrode GE1 and the lower metal layer BML, and may be connected to the first source electrode SE1 and the first drain electrode DE1. For example, both ends of the first semiconductor pattern SCP1 may be connected to the first source electrode SE1 and the first drain electrode DE1 through a corresponding contact hole CH.

The first gate electrode GE1 may be electrically connected to a lower electrode LE of the storage capacitor Cst and a second source electrode SE2 of the second transistor T2.

The first source electrode SE1 may be electrically connected to an upper electrode UE of the storage capacitor Cst and a third source electrode SE3. In addition, in one or more embodiments, the first source electrode SE1 may be connected to the first electrode EU (refer to FIGS. 14 and 15) of the corresponding sub-pixel SPX through each first contact hole CH1.

The first drain electrode DE1 may be electrically connected to the first power line PL1. For example, the first drain electrode DE1 may be connected to the first power line PL1 through at least one contact hole.

The lower metal layer BML may overlap the first semiconductor pattern SCP1 and the first gate electrode GE1, and may be electrically connected to the first source electrode SE1.

The second transistor T2 of each sub-pixel may include a second semiconductor pattern SCP2, a second gate electrode GE2, the second source electrode SE2, and a second drain electrode DE2.

The second semiconductor pattern SCP2 may overlap the second gate electrode GE2 and may be connected to the second source electrode SE2 and the second drain electrode DE2.

The second gate electrode GE2 may be connected to the scan line SL. For example, the second gate electrode GE2 may be connected to each scan line SL (for example, the first sub scan line SLn_H of the n-th scan line SLn) through at least one contact hole.

The second source electrode SE2 may be electrically connected to the lower electrode LE of the storage capacitor Cst and the first gate electrode GE1.

The second drain electrode DE2 may be connected to the sub data line of the corresponding sub-pixel SPX. For example, the second drain electrode DE2 of a first pixel circuit PXC1 may be connected to the first sub data line D1 through at least one contact hole, the second drain electrode DE2 of a second pixel circuit PXC2 may be connected to the second sub data line D2 through at least one contact hole, and the second drain electrode DE2 of a third pixel circuit PXC3 may be connected to the third sub data line D3 through at least one contact hole.

The third transistor T3 of each sub-pixel may include a third semiconductor pattern SCP3, a third gate electrode GE3, the third source electrode SE3, and a third drain electrode DE3.

The third semiconductor pattern SCP3 may overlap the third gate electrode GE3 and may be connected to the third source electrode SE3 and the third drain electrode DE3.

The third gate electrode GE3 may be connected to each scan line SL or may be connected to a separate control line separated from the scan line SL. In one or more embodiments, the third gate electrode GE3 may be integrally connected with the second gate electrode GE2, and may be connected to each scan line SL through at least one contact hole.

The third source electrode SE3 may be connected to the upper electrode UE of the storage capacitor Cst and the first source electrode SE1. For example, the third source electrode SE3 may be integrally connected with the upper electrode UE of the storage capacitor Cst and the first source electrode SE1.

The third drain electrode DE3 may be connected to the sensing line SENL. For example, the third drain electrode DE3 may be connected to the sensing line SENL through at least one contact hole CH.

The storage capacitor Cst may include the lower electrode LE and the upper electrode UE.

The lower electrode LE of the storage capacitor Cst may be connected to the first gate electrode GE1 and the second source electrode SE2. The upper electrode UE of the storage capacitor Cst may be connected to the first source electrode SE1 and the third source electrode SE3.

Figure 18:
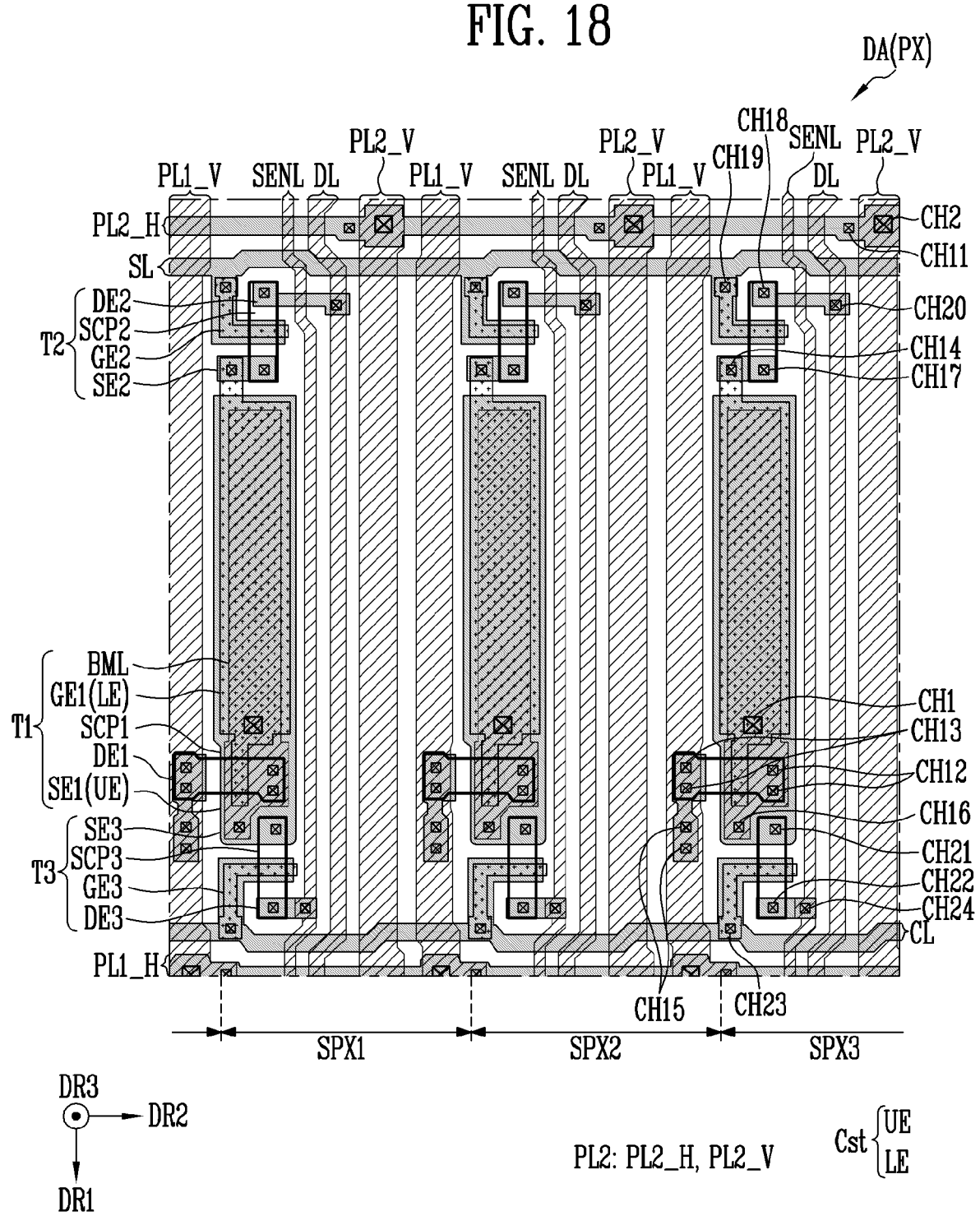
FIG. 18 is a plan view illustrating an example of a pixel disposed in the display area of FIG. 2.

FIG. 18 is a plan view illustrating an example of a pixel disposed in the display area DA of FIG. 2.

Referring to FIG. 18, a pixel PX may include the first sub-pixel SPX1, the second sub-pixel SPX2, and the third sub-pixel SPX3. For example, the first sub-pixel SPX1, the second sub-pixel SPX2, and the third sub-pixel SPX3 may be disposed adjacent to each other in the second direction DR2.

The pixel PX may include the scan line SL, the control line CL, the data line DL, the sensing line SENL, and the first and second power lines PL1 and PL2.

The scan line SL may extend in the second direction DR2. The scan line SL may be disposed across the first sub-pixel SPX1, the second sub-pixel SPX2, and the third sub-pixel SPX3. A scan signal may be applied to the scan line SL, and the scan signal may be supplied to each of the first sub-pixel SPX1, the second sub-pixel SPX2, and the third sub-pixel SPX3.

The control line CL may extend in the second direction DR2. One control line CL may be disposed across the first sub-pixel SPX1, the second sub-pixel SPX2, and the third sub-pixel SPX3. A control signal may be applied to the control line CL, and the control signal may be supplied to each of the first sub-pixel SPX1, the second sub-pixel SPX2, and the third sub-pixel SPX3.

The data line DL may extend in the first direction DR1 perpendicular to the second direction DR2. The data line DL may be disposed perpendicular to the scan line SL. A data line DL may be disposed in each sub-pixel. A data voltage may be applied to the data line DL, and the data voltage may be supplied to each of the first sub-pixel SPX1, the second sub-pixel SPX2, and the third sub-pixel SPX3.

The sensing line SENL may extend in the first direction DR1 and may be disposed adjacent to the data line DL. A sensing line SENL may be disposed in each sub-pixel. An initialization voltage may be applied to the sensing line SENL during a period (e.g., a predetermined period), and the initialization voltage may be supplied to each of the first sub-pixel SPX1, the second sub-pixel SPX2, and the third sub-pixel SPX3. In addition, the sensing line SENL may detect a characteristic of each sub-pixel from the third transistor T3 during a period (e.g., a predetermined period).

The first power line PL1 may include a (1-1)-th sub power line PL1_V extending in the first direction DR1 and a (1-2)-th sub power line PL1_H extending in the second direction DR2. The (1-1)-th sub power line PL1_V may extend in the first direction DR1 and may be disposed adjacent to the data line DL. The (1-1)-th sub power line PL1_V and the (1-2)-th sub power line PL1_H may cross each other and may be electrically connected through a contact hole. A first power line PL1 may be disposed in each sub-pixel. A first driving voltage may be applied to the first power line PL1, and the first driving voltage may be supplied to each of the first sub-pixel SPX1, the second sub-pixel SPX2, and the third sub-pixel SPX3.

The second power line PL2 may include a (2-1)-th sub power line PL2_V extending in the first direction DR1 and a (2-2)-th sub power line PL2_H extending in the second direction DR2. The (2-1)-th sub power line PL2_V and the (2-2)-th sub power line PL2_H may cross each other and may be electrically connected through an eleventh contact hole CH11. A second driving voltage may be applied to the second power line PL2, and the second driving voltage may be supplied to each of the first sub-pixel SPX1, the second sub-pixel SPX2, and the third sub-pixel SPX3. The second power line PL2 may be electrically connected to the second electrode EL2 (refer to FIG. 16) of the light emitting unit EMU through a second contact hole CH2.

Each of the sub-pixels may include the first transistor T1, the second transistor T2, the third transistor T3, and the storage capacitor Cst.

The first transistor T1 of each sub-pixel may include the first semiconductor pattern SCP1, the first gate electrode GE1, the first source electrode SE1, and the first drain electrode DE1. In addition, the first transistor T1 of each sub-pixel may further include the lower metal layer BML overlapping the first gate electrode GE1.

The first semiconductor pattern SCP1 may at least partially overlap the first gate electrode GE1 and the lower metal layer BML, and may be connected to the first source electrode SE1 and the first drain electrode DE1. For example, both ends of the first semiconductor pattern SCP1 may be connected to the first source electrode SE1 and the first drain electrode DE1 through a twelfth contact hole CH12 and a thirteenth contact hole CH13, respectively.

The first gate electrode GE1 may partially extend in the first direction DR1, and may at least partially overlap the lower metal layer BML, the first semiconductor pattern SCP1, the second source electrode SE2 of the second transistor T2, and the first source electrode SE1 (or the third source electrode SE3 of the third transistor T3). For example, the first gate electrode GE1 may be integrally implemented with the lower electrode LE of the storage capacitor Cst, and may be electrically connected to the second source electrode SE2 through a fourteenth contact hole CH14.

The first source electrode SE1 may be integrally implemented with the third source electrode SE3 of the third transistor T3. In addition, the first source electrode SE1 may be integrally implemented with the upper electrode UE of the storage capacitor Cst. The first source electrode SE1 may be connected to the first electrode EL1 (refer to FIG. 16) of the corresponding sub-pixel through the first contact hole CH1.

The first drain electrode DE1 may at least partially overlap the first power line PL1 and may be electrically connected to the first power line PL1 through a fifteenth contact hole CH15.

The lower metal layer BML may overlap the first semiconductor pattern SCP1 and the first gate electrode GE1, and may be electrically connected to the first source electrode SE1 through a sixteenth contact hole CH16.

The second transistor T2 of each sub-pixel may include the second semiconductor pattern SCP2, the second gate electrode GE2, the second source electrode SE2, and the second drain electrode DE2.

The second semiconductor pattern SCP2 may at least partially overlap the second gate electrode GE2 and may be connected to the second source electrode SE2 and the second drain electrode DE2. For example, both ends of the second semiconductor pattern SCP2 may be connected to the second source electrode SE2 and the second drain electrode DE2 through a seventeenth contact hole CH17 and an eighteenth contact hole CH18, respectively.

The second gate electrode GE2 may have an island shape partially extending in the first direction DR1 and the second direction DR2. The second gate electrode GE2 may at least partially overlap the scan line SL, and may be electrically connected to the scan line SL through a nineteenth contact hole CH19.

The second source electrode SE2 may have an island shape adjacent to the second gate electrode GE2. The second source electrode SE2 may be electrically connected to the lower electrode LE of the storage capacitor Cst and the first gate electrode GE1.

The second drain electrode DE2 may have an island shape adjacent to the second gate electrode GE2. The second drain electrode DE2 may at least partially overlap the data line DL, and may be electrically connected to the data line DL through a twentieth contact hole CH20.

The third transistor T3 of each sub-pixel may include the third semiconductor pattern SCP3, the third gate electrode GE3, the third source electrode SE3, and the third drain electrode DE3.

The third semiconductor pattern SCP3 may at least partially overlap the third gate electrode GE3 and the first source electrode SE1, and may be connected to the third source electrode SE3 and the third drain electrode DE3 through a twenty-first contact hole CH21 and a twenty-second contact hole CH22, respectively.

The third gate electrode GE3 may have an island shape partially extending in the first direction DR1 and the second direction DR2. The third gate electrode GE3 may at least partially overlap the control line CL, and may be electrically connected to the control line CL through a twenty-third contact hole CH23.

The third source electrode SE3 may be connected to the upper electrode UE of the storage capacitor Cst and the first source electrode SE1. For example, the third source electrode SE3 may be integrally connected with the upper electrode UE of the storage capacitor Cst and the first source electrode SE1.

The third drain electrode DE3 may have an island shape adjacent to the third gate electrode GE3. The third drain electrode DE3 may at least partially overlap the sensing line SENL, and may be electrically connected to the sensing line SENL through a twenty-fourth contact hole CH24.

The storage capacitor Cst may include the lower electrode LE and the upper electrode UE.

The lower electrode LE of the storage capacitor Cst may be connected to the first gate electrode GE1 and the second source electrode SE2. The upper electrode UE of the storage capacitor Cst may be connected to the first source electrode SE1 and the third source electrode SE3.

Although the present disclosure has been described with reference to the embodiments above, those skilled in the art or those having a common knowledge in the art will understand that the present disclosure may be variously modified and changed without departing from the spirit and technical area of the present disclosure described in the claims which will be described later.

Therefore, the technical scope of the present disclosure should not be limited to the contents described in the detailed description of the specification, but should be defined by the claims and their equivalents.

What is claimed is:

1. A pixel comprising:
    a first transistor comprising a first electrode connected to a first power line configured to receive a first driving voltage, a second electrode connected to a first node, and a gate electrode connected to a second node;
    a second transistor comprising a first electrode connected to a data line, a second electrode connected to the second node, and a gate electrode connected to a scan line;
    a third transistor comprising a first electrode connected to a first sensing line, a second electrode connected to the first node, and a gate electrode connected to a first control line;
    a fourth transistor comprising a first electrode connected to a second sensing line, a second electrode connected to a third node, and a gate electrode connected to a second control line;
    a first sub light emitting unit comprising a plurality of light emitting elements connected in a forward direction between a first electrode of the first sub light emitting unit connected to the first node and a second electrode of the first sub light emitting unit connected to the third node; and
    a second sub light emitting unit comprising a plurality of light emitting elements connected in the forward direction between a first electrode of the second sub light emitting unit connected to the third node and a second electrode of the second sub light emitting unit connected to a second power line configured to receive a second driving voltage different from the first driving voltage,
    wherein:
        a first reference voltage is supplied to the first sensing line when the third transistor is turned on;
        a second reference voltage substantially equal to the first reference voltage is supplied to the second sensing line when the fourth transistor is turned on; and
        the second reference voltage is higher than the second driving voltage.

2. The pixel according to claim 1, wherein the first sub light emitting unit is electrically connected to the first sensing line through the third transistor, and
    wherein the second sub light emitting unit is electrically connected to the second sensing line through the fourth transistor.

3. The pixel according to claim 2, wherein:
    the first reference voltage is supplied to the first sensing line when the third transistor is turned on; and
    the second reference voltage lower than the first reference voltage is supplied to the second sensing line when the fourth transistor is turned on.

4. The pixel according to claim 3, wherein when the third transistor and the fourth transistor are turned on, the first transistor and the second transistor are turned off.

5. The pixel according to claim 4, wherein at least one light emitting element from among the plurality of light emitting elements of the first sub light emitting unit is configured to receive a current corresponding to a difference between the first reference voltage and the second reference voltage.

6. The pixel according to claim 2, wherein when the third transistor and the fourth transistor are turned on, the first transistor and the second transistor are turned off.

7. The pixel according to claim 6, wherein at least one light emitting element from among the plurality of light emitting elements of the second sub light emitting unit is configured to receive a current corresponding to a difference between the second reference voltage and the second driving voltage.

8. The pixel according to claim 1, wherein each of the plurality of light emitting elements comprises:
a first semiconductor layer;
a second semiconductor layer different from the first semiconductor layer; and
an active layer between the first semiconductor layer and the second semiconductor layer.

9. A pixel comprising:
a first transistor comprising a first electrode connected to a first power line configured to receive a first driving voltage, a second electrode connected to a first node, and a gate electrode connected to a second node;
a second transistor comprising a first electrode connected to a data line, a second electrode connected to the second node, and a gate electrode connected to a scan line;
a third transistor comprising a first electrode connected to a first sensing line, a second electrode connected to the first node, and a gate electrode connected to a first control line;
a fourth transistor comprising a first electrode connected to a second sensing line, a second electrode connected to a third node, and a gate electrode connected to a second control line;
a first sub light emitting unit comprising at least one light emitting element connected in a reverse direction between a first electrode of the first sub light emitting unit connected to the third node and a second electrode of the first sub light emitting unit connected to the first node; and
a second sub light emitting unit comprising at least one light emitting element connected in the reverse direction between a first electrode of the second sub light emitting unit connected to a second power line configured to receive a second driving voltage different from the first driving voltage and a second electrode of the second sub light emitting unit connected to the third node.

10. The pixel according to claim 9, wherein:
a first reference voltage is supplied to the first sensing line when the first transistor and the second transistor are turned off and the third transistor and the fourth transistor are turned on;
a second reference voltage higher than the first reference voltage is supplied to the second sensing line when the first transistor and the second transistor are turned off and the third transistor and the fourth transistor are turned on; and
the second reference voltage is the same as the second driving voltage.

11. The pixel according to claim 10, wherein the at least one light emitting element of the first sub light emitting unit is configured to receive a current corresponding to a difference between the first reference voltage and the second reference voltage.

12. The pixel according to claim 9, wherein:
a first reference voltage is supplied to the first sensing line when the first transistor and the second transistor are turned off and the third transistor and the fourth transistor are turned on;
a second reference voltage substantially equal to the first reference voltage is supplied to the second sensing line when the first transistor and the second transistor are turned off and the third transistor and the fourth transistor are turned on; and
the second reference voltage is lower than the second driving voltage.

13. The pixel according to claim 12, wherein the at least one light emitting element of the second sub light emitting unit is configured to receive a current corresponding to a difference between the second reference voltage and the second driving voltage.

14. A display device driven during a display period and a sensing period, the display device comprising:
a pixel comprising a first sub light emitting unit comprising a plurality of light emitting elements and electrically connected to a first sensing line, and a second sub light emitting unit comprising a plurality of light emitting elements and electrically connected to a second sensing line; and
a sensing unit electrically connected to the first sensing line and the second sensing line,
wherein the sensing unit is configured to determine a number of the plurality of light emitting elements of the first sub light emitting unit and a number of the plurality of light emitting elements of the second sub light emitting unit based on a first sub detection current flowing through the first sub light emitting unit and a second sub detection current flowing through the second sub light emitting unit during the sensing period,
wherein the sensing unit is configured to supply a first reference voltage to the first sensing line and a second reference voltage substantially equal to the first reference voltage to the second sensing line, and
wherein the second reference voltage is higher than a second driving voltage received at the second sub light emitting unit.

15. The display device according to claim 14, wherein the pixel further comprises:
a first transistor comprising a first electrode connected to a first power line configured to receive a first driving voltage, a second electrode connected to a first node, and a gate electrode connected to a second node;
a second transistor comprising a first electrode connected to a data line, a second electrode connected to the second node, and a gate electrode connected to a scan line;
a third transistor comprising a first electrode connected to the first sensing line, a second electrode connected to the first node, and a gate electrode connected to a first control line; and
a fourth transistor comprising a first electrode connected to the second sensing line, a second electrode connected to a third node, and a gate electrode connected to a second control line,
wherein at least one light emitting element of the first sub light emitting unit is connected in a forward direction between a first electrode of the first sub light emitting unit connected to the first node and a second electrode of the first sub light emitting unit connected to the third node, and
wherein at least one light emitting element of the second sub light emitting unit is connected in the forward direction between a first electrode of the second sub light emitting unit connected to the third node and a second electrode of the second sub light emitting unit connected to a second power line configured to receive the second driving voltage different from the first driving voltage.

16. The display device according to claim 15, wherein the sensing unit is configured to supply the first reference voltage to the first sensing line and the second reference voltage lower than the first reference voltage to the second sensing line.

17. The display device according to claim 16, wherein the sensing unit is configured to determine the number of light emitting elements of the first sub light emitting unit with a value obtained by dividing a first detection current applied to the first sub light emitting unit through the first node by the first sub detection current.

18. The display device according to claim 15, wherein the sensing unit is configured to determine the number of light emitting elements of the second sub light emitting unit with a value obtained by dividing a second detection current applied to the second sub light emitting unit through the third node by the second sub detection current.

* * * * *